US012748688B2

(12) United States Patent
Kim et al.

(10) Patent No.: US 12,748,688 B2
(45) Date of Patent: Sep. 29, 2026

(54) STORAGE CONTROLLER, STORAGE DEVICE INCLUDING THE SAME, AND OPERATING METHOD

(71) Applicant: Samsung Electronics Co., Ltd., Suwon-si (KR)

(72) Inventors: Hyungjin Kim, Suwon-si (KR); Junyeol Lee, Suwon-si (KR); Chulseung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/957,010

(22) Filed: Nov. 22, 2024

(65) Prior Publication Data

US 2025/0383979 A1 Dec. 18, 2025

(30) Foreign Application Priority Data

Jun. 13, 2024 (KR) ........................ 10-2024-0077256

(51) Int. Cl.
*G06F 12/02* (2006.01)
*G06F 13/16* (2006.01)
*G11C 7/10* (2006.01)

(52) U.S. Cl.
CPC ...... *G06F 12/0223* (2013.01); *G06F 13/1668* (2013.01); *G11C 7/1006* (2013.01)

(58) Field of Classification Search
None
See application file for complete search history.

(56) References Cited

U.S. PATENT DOCUMENTS 9,280,454 B1 * 3/2016 Elsasser ............... G11C 7/1006
2006/0236042 A1 * 10/2006 Jain ..................... G06F 13/4239 711/154
2007/0005836 A1 * 1/2007 Jain .......................... G11C 7/04 710/62

(Continued)

FOREIGN PATENT DOCUMENTS

KR 2010/0108697 A 10/2010
KR 2019/0058281 A 5/2019

OTHER PUBLICATIONS

Extended European Search Report in European Appln. No. 24220481.6, mailed on May 28, 2025, 8 pages.

*Primary Examiner* — Nathan Sadler
(74) *Attorney, Agent, or Firm* — Fish & Richardson P.C.

(57) ABSTRACT

A storage device comprising a storage controller including a plurality of first data pins and configured to send a command through a command/address (CA) line, the command including a first data pattern; and a memory device including a plurality of second data pins connected to the plurality of first data pins through a plurality of data lines, and configured to, in response to receiving the command from the storage controller, generate a second data pattern corresponding to the first data pattern based on the command, and send the second data pattern to the storage controller through the plurality of data lines, and the storage controller configured to receive a third data pattern in response to the memory device sending the second data pattern, and determine a connection structure between the plurality of first data pins and the plurality of second data pins based on the second and third data patterns.

20 Claims, 23 Drawing Sheets

(56) References Cited

U.S. PATENT DOCUMENTS

| | | | | |
|---|---|---|---|---|
| 2010/0246276 | A1 | 9/2010 | Noh | |
| 2011/0153925 | A1* | 6/2011 | Bains | G06F 13/1678 711/E12.001 |
| 2014/0189224 | A1 | 7/2014 | Kostinsky et al. | |
| 2014/0195765 | A1* | 7/2014 | Abali | G06F 11/1004 711/168 |
| 2015/0095547 | A1* | 4/2015 | Bains | G06F 3/0635 711/5 |
| 2017/0076768 | A1 | 3/2017 | Son et al. | |
| 2018/0059933 | A1 | 3/2018 | Helmick et al. | |
| 2018/0144812 | A1* | 5/2018 | Yu | G11C 29/10 |
| 2022/0101893 | A1 | 3/2022 | Park et al. | |
| 2022/0206695 | A1* | 6/2022 | Zhao | G06F 3/0604 |
| 2022/0262415 | A1* | 8/2022 | Menon | G11C 29/022 |
| 2023/0298640 | A1* | 9/2023 | Ivan | G11C 29/028 365/191 |
| 2024/0013851 | A1* | 1/2024 | Chen | G06F 11/1048 |
| 2024/0126681 | A1* | 4/2024 | Wei | G06F 12/0223 |
| 2024/0311231 | A1* | 9/2024 | Ayyapureddi | G06F 11/1048 |

* cited by examiner

| | DQ[0] | DQ[1] | DQ[2] | DQ[3] | DQ[4] | DQ[5] | DQ[6] | DQ[7] |
|---|---|---|---|---|---|---|---|---|
| DP1 | 1 | 1 | 1 | 1 | 0 | 0 | 0 | 0 |
| DP2 | 0 | 0 | 0 | 0 | 1 | 1 | 1 | 1 |
| DP3 | 0 | 0 | 0 | 0 | 1 | 1 | 1 | 1 |

910

| | DQ[0] | DQ[1] | DQ[2] | DQ[3] | DQ[4] | DQ[5] | DQ[6] | DQ[7] |
|---|---|---|---|---|---|---|---|---|
| DP1 | 1 | 1 | 1 | 1 | 0 | 0 | 0 | 0 |
| DP2 | 0 | 0 | 0 | 0 | 1 | 1 | 1 | 1 |
| DP3 | 1 | 1 | 1 | 1 | 0 | 0 | 0 | 0 |

920

FIG. 9

| | | DQ[0] | DQ[1] | DQ[2] | DQ[3] | DQ[4] | DQ[5] | DQ[6] | DQ[7] |
|---|---|---|---|---|---|---|---|---|---|
| 1st pattern | DP2 | 1 | 0 | 0 | 0 | 0 | 0 | 0 | 0 |
| | DP3 | 1 | 0 | 0 | 0 | 0 | 0 | 0 | 0 |
| 2nd pattern | DP2 | 0 | 1 | 0 | 0 | 0 | 0 | 0 | 0 |
| | DP3 | 0 | 1 | 0 | 0 | 0 | 0 | 0 | 0 |
| 3rd pattern | DP2 | 0 | 0 | 1 | 0 | 0 | 0 | 0 | 0 |
| | DP3 | 0 | 0 | 1 | 0 | 0 | 0 | 0 | 0 |
| 4th pattern | DP2 | 0 | 0 | 0 | 1 | 0 | 0 | 0 | 0 |
| | DP3 | 0 | 0 | 0 | 1 | 0 | 0 | 0 | 0 |
| 5th pattern | DP2 | 0 | 0 | 0 | 0 | 1 | 0 | 0 | 0 |
| | DP3 | 0 | 0 | 0 | 0 | 0 | 0 | 0 | 1 |
| 6th pattern | DP2 | 0 | 0 | 0 | 0 | 0 | 1 | 0 | 0 |
| | DP3 | 0 | 0 | 0 | 0 | 0 | 0 | 1 | 0 |
| 7th pattern | DP2 | 0 | 0 | 0 | 0 | 0 | 0 | 1 | 0 |
| | DP3 | 0 | 0 | 0 | 0 | 0 | 1 | 0 | 0 |
| 8th pattern | DP2 | 0 | 0 | 0 | 0 | 0 | 0 | 0 | 1 |
| | DP3 | 0 | 0 | 0 | 0 | 1 | 0 | 0 | 0 |

FIG. 10

| DP2 | DQ[0] | DQ[1] | DQ[2] | DQ[3] | DQ[4] | DQ[5] | DQ[6] | DQ[7] |
|---|---|---|---|---|---|---|---|---|
| 1st pattern | 0 | 0 | 0 | 0 | 1 | 1 | 1 | 1 |
| 2nd Pattern | 0 | 0 | 1 | 1 | 0 | 0 | 1 | 1 |
| 3rd Pattern | 0 | 1 | 0 | 1 | 0 | 1 | 0 | 1 |
| | ID0 | ID1 | ID2 | ID3 | ID4 | ID5 | ID6 | ID7 |

| DP3 | DQ[0] | DQ[1] | DQ[2] | DQ[3] | DQ[4] | DQ[5] | DQ[6] | DQ[7] |
|---|---|---|---|---|---|---|---|---|
| 1st pattern | 0 | 0 | 0 | 0 | 1 | 1 | 1 | 1 |
| 2nd Pattern | 0 | 0 | 1 | 1 | 1 | 1 | 0 | 0 |
| 3rd Pattern | 0 | 1 | 0 | 1 | 1 | 0 | 1 | 0 |
| | ID0 | ID1 | ID2 | ID3 | ID7 | ID6 | ID5 | ID4 |

FIG. 11

STORAGE CONTROLLER, STORAGE DEVICE INCLUDING THE SAME, AND OPERATING METHOD

CROSS-REFERENCE TO RELATED APPLICATION

This application claims priority under 35 U.S.C. § 119 to Korean Patent Application No. 10-2024-0077256, filed in the Korean Intellectual Property Office on Jun. 13, 2024, the contents of which is hereby incorporated by reference in its entirety.

BACKGROUND

Field

The present inventive concepts relate to a storage controller, a storage device including the same, and an operating method thereof.

Description of Related Art

A semiconductor memory may be classified into a volatile memory device such as a static RAM (SRAM), a dynamic RAM (DRAM), a synchronous DRAM (SDRAM), etc., in which stored data is destroyed upon power cut off, and a non-volatile memory device such as a read only memory (ROM), a programmable ROM (PROM), an electrically erasable and programmable ROM (EPROM), a flash memory device, a phase-change RAM (PRAM), a magnetic RAM (MRAM), a respective RAM (RRAM), a ferroelectric RAM (FRA), etc., in which stored data is maintained even when power is cut off.

Memory devices can be widely used as a mass storage medium in computing systems. The memory device may be configured to communicate with the storage controller based on various electrical signals.

However, if each chip is assigned with a separate pin to determine the connection method of the data line used for transmitting or sending and receiving data between the memory device and the storage controller, there may be a problem of increasing the size of the storage device. For example, a size of the storage device may be increased due to the addition of the separate pin for determining the connection method.

The information described above is intended to improve understanding of the background of the present inventive concepts, and may include information that does not constitute the related art.

SUMMARY

In order to solve one or more problems (e.g., the problems described above and/or other problems not explicitly described herein), the present inventive concepts provide a storage controller, a storage device including the same, and an operating method thereof.

The problems to be solved by the present inventive concepts are not limited to those described above, and other problems not mentioned can be clearly understood by those skilled in the art from the description of some example embodiments below.

According to some example embodiments, a storage device may include a storage controller including a plurality of first data pins, the storage controller configured to send a command through a command/address (CA) line, the command including a first data; and a memory device including a plurality of second data pins connected to the plurality of first data pins through a plurality of data lines, and the memory device is configured to, in response to receiving the command from the storage controller, generate a second data pattern corresponding to the first data pattern based on the command, and send the second data pattern to the storage controller through the plurality of data lines, and the storage controller is configured to receive a third data pattern in response to the memory device sending the second data pattern, and determine a connection structure between the plurality of first data pins and the plurality of second data pins based on the second data pattern and the third data pattern.

According to some example embodiments, a storage controller may include a plurality of first data pins; processing circuitry configured to generate a first data pattern; and a logic circuit configured to, send a command including the generated first data pattern to a memory device through a command/address line; receive, in response to receiving a second data pattern from the memory device through a plurality of data lines, a third data pattern, the second data pattern generated based on the command; and determine, based on the second data pattern and the third data pattern, a connection structure between the plurality of first data pins and a plurality of second data pins of the memory device, the plurality of first data pins being connected to the plurality of second data pins through the plurality of data lines.

A method of operating a storage device including a storage controller and a memory device, the method comprising sending, by the storage controller, a command including a first data pattern, through a command/address line; generating, by the memory device, in response to receiving the command from the storage controller, a second data pattern corresponding to the first data pattern based on the command; sending, by the memory device, the second data pattern to the storage controller through a plurality of data lines; receiving, by the storage controller, in response to the memory device transmitting the second data pattern, a third data pattern; and determining, by the storage controller, based on the second data pattern and the third data pattern, a connection structure between a plurality of first data pins of the storage controller and a plurality of second data pins of the memory device, the plurality of first data pins and the plurality of second data pins being connected to each other through the plurality of data lines.

According to some example embodiments of the present inventive concepts, it is possible to determine and predict the connection method without requiring a separate pin to be additionally allocated to the storage device to indicate the connection method between the non-volatile memory device and the storage controller, and accordingly, it is possible to reduce or prevent the size of the non-volatile memory device and the storage controller from being increased due to the addition of the separate pin.

According to some example embodiments of the present inventive concepts, because there may not be a need to additionally allocate a separate pin to the storage device to indicate the connection method between the non-volatile memory device and the storage controller, various types of connection structures can be applied to reduce, mitigate, or prevent interference between data lines and improve signal integrity (SI).

The effects that can be obtained through the present inventive concepts are not limited to the example embodiments described above. Technical effects not mentioned herein will be clearly understood by those skilled in the art from the description of the present inventive concepts described below.

BRIEF DESCRIPTION OF THE DRAWINGS

FIGS. 9 to 11 are diagrams illustrating examples of the second data pattern and the third data pattern of FIGS. 7A to 7D, according to some example embodiments;

DETAILED DESCRIPTION

Figure 1:
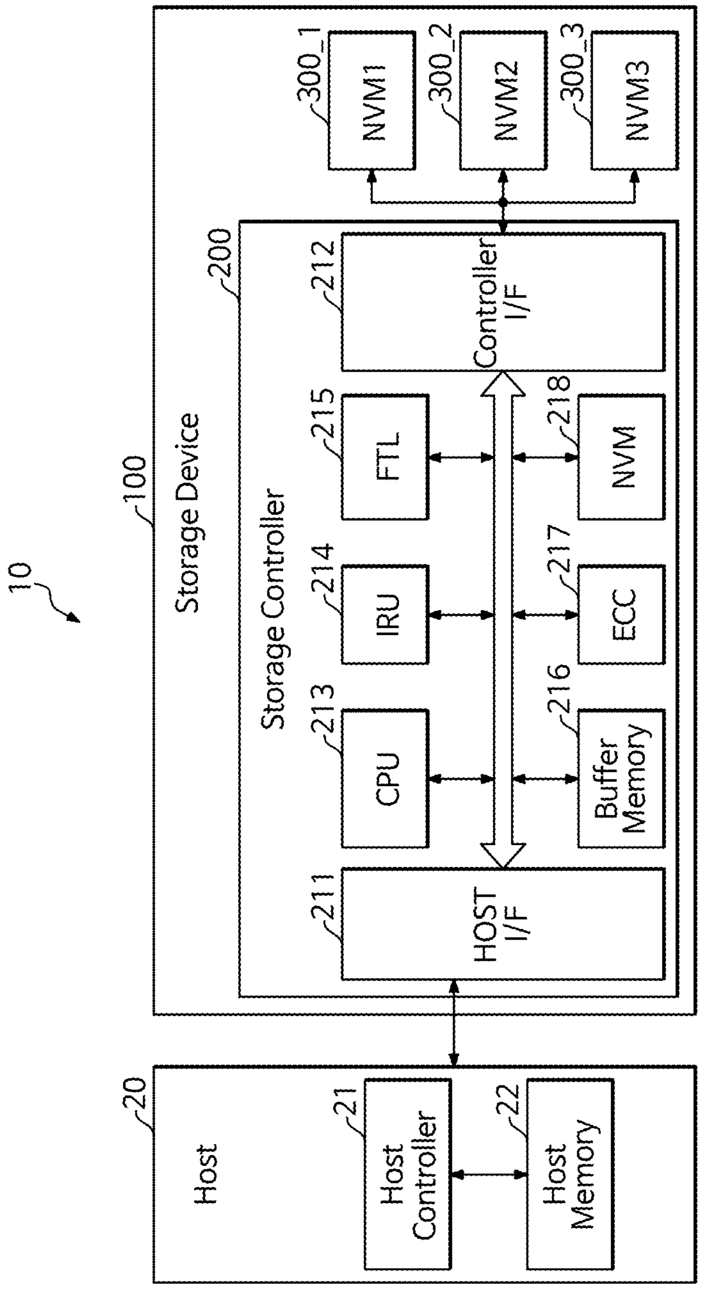
FIG. 1 is a block diagram provided to explain a storage system according to some example embodiments.

Hereinafter, various aspects of the present inventive concepts will be described with reference to FIGS. 1 to 16. The same reference numerals may refer to the same components throughout the description.

FIG. 1 is a block diagram provided to explain a storage system 10 according to some example embodiments. Referring to FIG. 1, the storage system 10 may include a host 20 and a storage device 100.

In some example embodiments, the host 20 may include a host controller 21 and a host memory 22. The host memory 22 may serve as a buffer memory for temporarily storing data to be transmitted, transferred, or sent to the storage device 100 or data transmitted, transferred, or sent from the storage device 100.

The host controller 21 and the host memory 22 may be implemented as separate semiconductor chips. Alternatively, in some example embodiments, the host controller 21 and the host memory 22 may be integrated on the same semiconductor chip. For example, the host controller 21 may be any one of a plurality of modules provided in the application processor, and the application processor may be implemented as a System on Chip (SoC). In some example embodiments, the host memory 22 may be an embedded memory provided in the application processor, or may be a volatile memory or memory module disposed or located outside the application processor.

The host controller 21 may manage the operation of storing data (e.g., write data) of the host memory 22 in non-volatile memory devices 300_1 to 300_3, or storing data (e.g., read data) of the memory devices 300_1 to 300_3 in the host memory 22. For example, the host controller 21 may manage the operation of storing user data associated with the execution of a specific, or alternatively desired program in the non-volatile memory devices 300_1 to 300_3. The storage device 100 may include a storage controller 200 and the plurality of non-volatile memory (NVM) devices 300_1 to 300_3.

The storage device 100 may include a storage medium for storing data according to a request from the host 20. For example, the storage device 100 may include at least one of a solid state drive (SSD), an embedded memory, and a removable external memory, but example embodiments are not limited thereto. In some example embodiments, if the storage device 100 is an SSD, the storage device 100 may be a device conforming to the non-volatile memory express (NVMe) standard. In some example embodiments, if the storage device 100 is an embedded memory or an external memory, the storage device 100 may be a device conforming to the universal flash storage (UFS) or embedded multimedia card (eMMC) standard. The host 20 and the storage device 100 may generate packets according to their adopted standard protocol and transmit, transfer, or send the same.

In some example embodiments, if the non-volatile memory devices 300_1 to 300_3 include a flash memory, the flash memory may include a 2D NAND memory array or a 3D (or vertical, or bonding-vertical) NAND (VNAND) memory array. According to some example embodiments, the storage device 100 may include various other types of non-volatile memories and/or volatile memories. For example, the storage device 100 may include at least one of volatile or non-volatile memories such as static RAM (SRAM), dynamic RAM (DRAM), synchronous DRAM (SDRAM), read only memory (ROM), programmable ROM (PROM), electrically programmable ROM (EPROM), electrically erasable and programmable ROM (EEPROM), magnetic RAM (MRAM), spin-transfer torque MRAM, conductive bridging RAM (CBRAM), ferroelectric RAM (FeRAM), phase RAM (PRAM), resistive RAM, etc., but example embodiments are not limited thereto. In some example embodiments, at least some of the plurality of non-volatile memory devices NVMs 300_1 to 300_3 may be volatile memory devices.

The storage controller 200 may include a host interface 211, a controller interface circuit 212, and a central processing unit (CPU) 213. In some example embodiments, the storage controller 200 may further include an index read unit (IRU) 214, a flash translation layer (FTL) 215, a buffer memory 216, an error correction code (ECC) engine 217, and an internal non-volatile memory 218. The storage controller 200 may further include a working memory loaded with the flash translation layer 215, and data writing and reading operation with respect to the non-volatile memory 218 may be controlled by the CPU 213 executing the flash translation layer 215. For example, the operation of writing the user data for the non-volatile memory devices 300_1 to 300_3 may be controlled by the CPU 213 executing the flash translation layer 215. According to some example embodiments, each of the index read unit (IRU) 214, flash translation layer (FTL) 215, buffer memory 216, and error correction code (ECC) engine 217, may include, may be included in, and/or may be implemented by one or more instances of processing circuitry such as hardware including logic circuits; a hardware/software combination such as a processor executing software; or a combination thereof. For example, the processing circuitry may include a non-transitory computer readable storage device (e.g., a memory) storing a program of instructions, and a processor configured to execute the program of instructions to implement the functionality and/or methods performed by some or all of the index read unit (IRU) 214, flash translation layer (FTL) 215, buffer memory 216, and error correction code (ECC) engine 217.

The host interface 211 may transmit, transfer, or send and receive packets to and from the host 20. The packet transmitted, transferred, or sent from the host 20 to the host interface 211 may include a command and/or data (e.g., user data), etc., to be written to the non-volatile memory devices 300_1 to 300_3, and the packet transmitted, transferred, or sent from the host interface 211 to the host 20 may include a response to command, or data read from the non-volatile memory devices 300_1 to 300_3, etc. While the host interface 211 is illustrated as being included in the storage controller 200, example embodiments are not limited thereto. In some example embodiments, the host interface 211 may be located outside the storage controller 200.

The controller interface circuit 212 may transmit, transfer, or send data (e.g., user data) to be written to the non-volatile memory devices 300_1 to 300_3 to the non-volatile memory devices 300_1 to 300_3, or may receive read data (e.g., user data) from the non-volatile memory devices 300_1 to 300_3. The controller interface circuit 212 may be implemented to comply with standard protocols such as Toggle or ONFI.

The flash translation layer 215 may perform several functions such as address mapping, wear-leveling, and garbage collection, etc. In some example embodiments, the buffer memory 216 may temporarily store data to be written to the memory devices 300_1 to 300_3 or data read from the non-volatile memory devices 300_1 to 300_3. The buffer memory 216 may be a component provided within the storage controller 200, but example embodiments are not limited thereto. According to some example embodiments, the buffer memory 216 may be provided outside the storage controller 200.

The ECC engine 217 may perform an error detection and correction function on read data read from the non-volatile memory devices 300_1 to 300_3. For example, the ECC engine 217 may generate a parity bit for write data to be written to the non-volatile memory devices 300_1 to 300_3, and the generated parity bit may be stored in the non-volatile memory devices 300_1 to 300_3 together with the write data. For example, when reading data from the non-volatile memory devices 300_1 to 300_3, the ECC engine 217 may use the parity bit read from the non-volatile memory devices 300_1 to 300_3 together with the read data to correct errors in the read data, and output the error-corrected read data.

Figure 2:
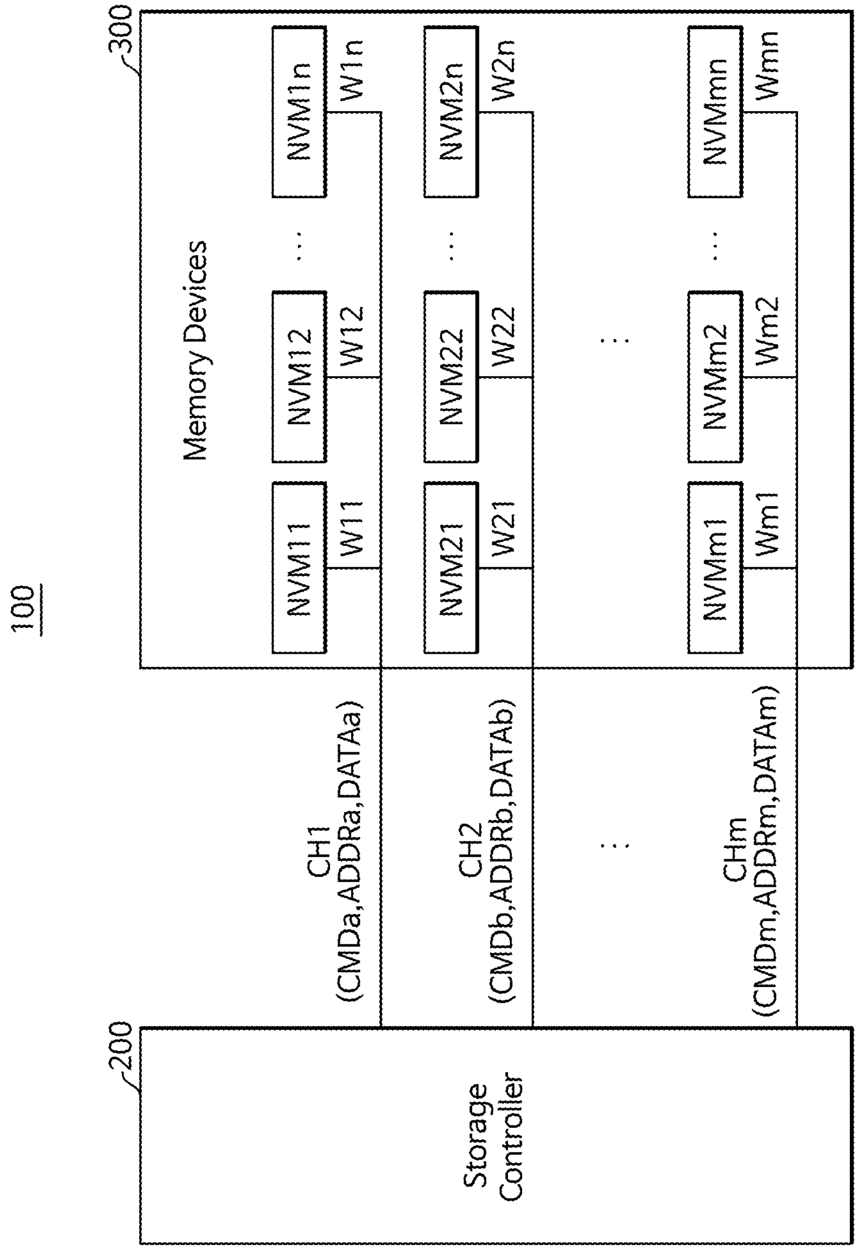
FIG. 2 is a block diagram provided to explain the storage device according to some example embodiments.

FIG. 2 is a block diagram provided to explain the storage device 100 according to some example embodiments.

Referring to FIG. 2, the memory devices 300 and the storage controller 200 may be connected to each other through a plurality of channels CH1 to CHm.

The memory devices 300 may include a plurality of non-volatile memory devices NVM11 to NVMmn. Here, m and n may be natural numbers. The plurality of non-volatile memory devices NVM11 to NVMmn may correspond to the plurality of non-volatile memory devices 300_1 to 300_3 of, e.g., FIG. 1.

Each of the non-volatile memory devices NVM11 to NVMmn may be connected to the storage controller 200 by being connected to one of the plurality of channels CH1 to CHm through each of a plurality of corresponding ways W11 to Wmn. Each of the non-volatile memory devices NVM11 to NVMmn may be implemented in any units of memories that may operate according to an individual command from the storage controller 200. For example, each of the non-volatile memory devices NVM11 to NVMmn may be implemented as a chip or die, but example embodiments are not limited thereto.

The storage controller 200 may transmit, transfer, or send and receive a data signal to and from the memory devices 300 through the plurality of channels CH1 to CHm. For example, the storage controller 200 may transmit, transfer, or send commands CMDa to CMDm, addresses ADDRa to ADDRm, and data DATAa to DATAm to the memory devices 300 through the channels CH1 to CHm, or may receive the data DATAa to DATAm from the memory devices 300.

The storage controller 200 may select one of the memory devices 300 connected to the corresponding channel through each channel, and transmit, transfer, or send and receive signals to and from the selected non-volatile memory device. In some example embodiments, each of the channels CH1 to CHm may include a command/address line and a plurality of data lines to be described below, and the plurality of non-volatile memory devices may be selectively connected to one channel to communicate with the storage controller 200.

The storage controller 200 may transmit, transfer, or send and receive signals to and from the memory devices 300 in parallel through different channels. For example, the storage controller 200 may transmit, transfer, or send a command CMDb to the memory device NVM21 through the second channel CH2, while transmitting, transferring, or sending a command CMDa to the memory device NVM11 through the first channel CH1. For example, the storage controller 200 may receive the data DATAb from the memory device NVM21 through the second channel CH2, while receiving the data DATAa from the memory device NVM11 through the first channel CH1.

FIG. 2 illustrates that the memory devices 300 communicate with the storage controller 200 through m channels and that the memory devices 300 include n non-volatile memory devices corresponding to each channel, but example embodiments are not limited thereto, and, in some example embodiments, the number of channels m and the number of non-volatile memory devices n connected to one channel may be variously changed.

FIGS. 3 to 14 and various example embodiments described below with reference to FIGS. 3 to 14 are illustrated and described based on the operations of the non-volatile memory device 300_1, which is one of the plurality of non-volatile memory devices NVM11 to NVMmn, but this is for convenience of explanation and example embodiments are not limited thereto.

Figure 3:
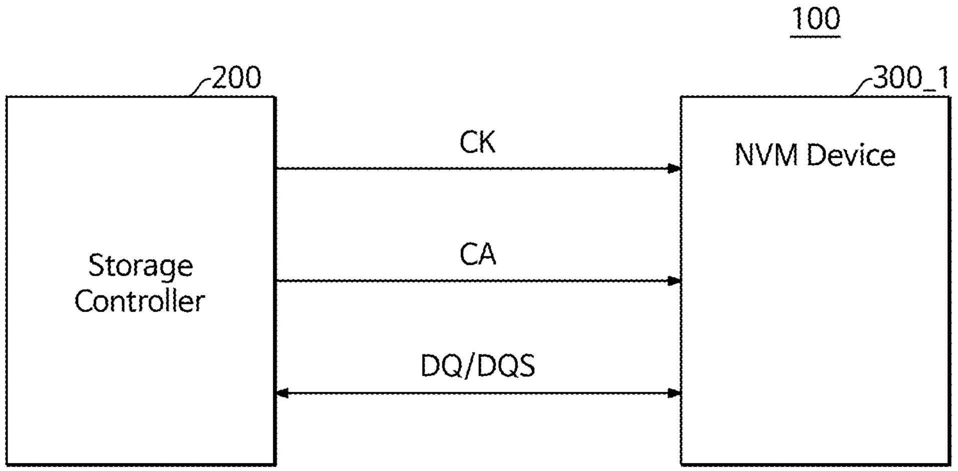
FIG. 3 is a block diagram illustrating signals transmitted or sent and received within the storage device according to some example embodiments.

FIG. 3 is a block diagram illustrating signals transmitted or sent and received within the storage device 100 according to some example embodiments.

The storage controller 200 may transmit, transfer or send a clock signal CK and a command/address signal CA to the non-volatile memory device 300_1, and may transmit, transfer, or send and receive a data signal DQ and a data strobe signal DQS to and from the non-volatile memory device 300_1.

The non-volatile memory device 300_1 may operate under the control of the storage controller 200. For example, the non-volatile memory device 300_1 may receive the clock signal CK and the command/address signal CA from the storage controller 200. The command/address signal CA may be transferred or sent to the non-volatile memory device 300_1 using a separate line from the data signal DQ.

In response to the received command/address signal CA, the non-volatile memory device 300_1 may transmit, transfer, or send data to the storage controller 200 through the data signal DQ and the data strobe signal DQS, or receive data from the storage controller 200 through the data signal DQ and the data strobe signal DQS.

Figure 4:
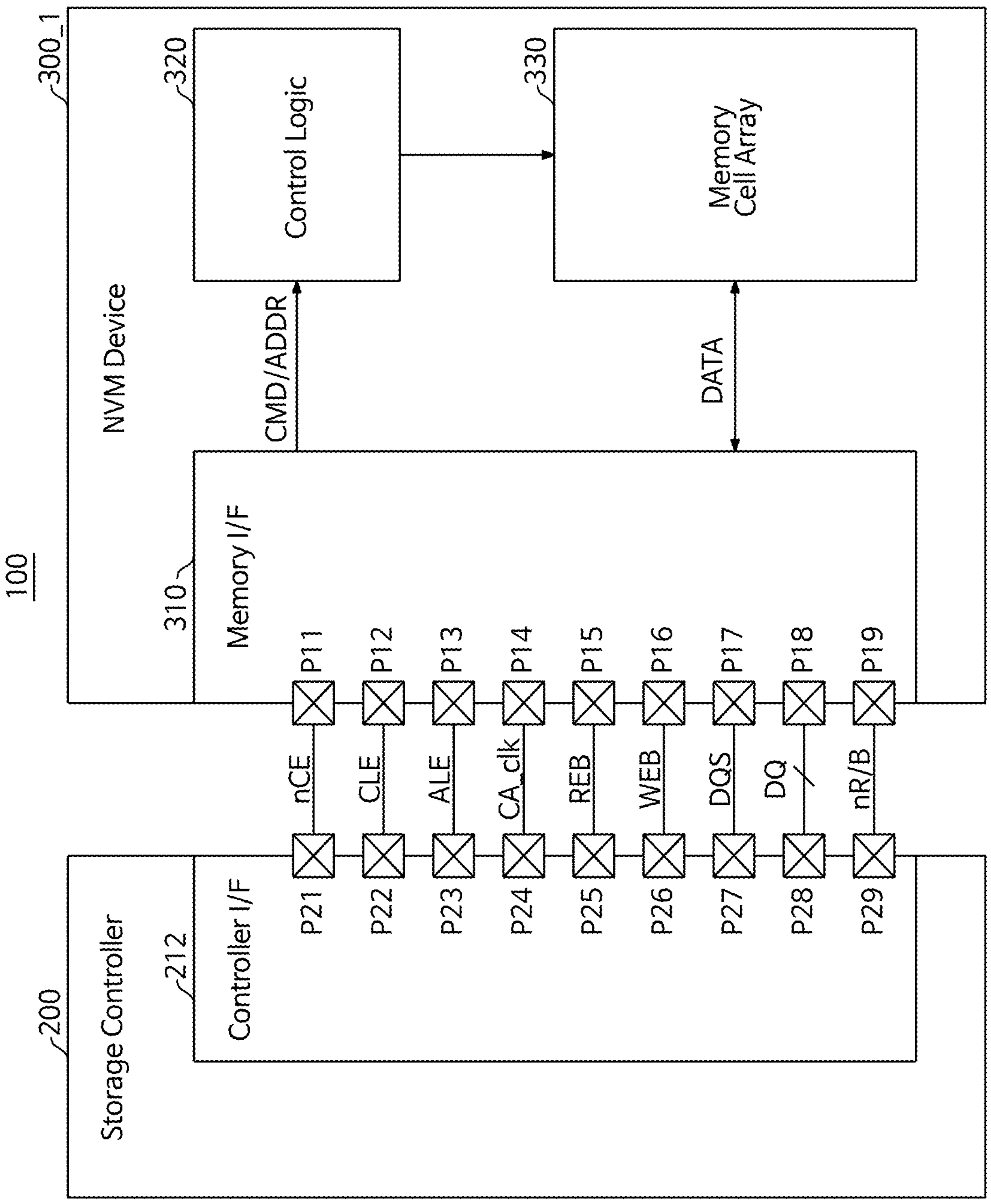
FIG. 4 is a block diagram provided to explain the storage device according to some example embodiments.

FIG. 4 is a block diagram provided to explain the storage device 100 according to some example embodiments. The non-volatile memory device 300_1 of FIG. 4 may correspond to any one of the non-volatile memory devices NVM11 to NVMmn (where, m and n are natural numbers) illustrated and described above with reference to, e.g., FIG. 2. The storage controller 200 and the non-volatile memory device 300_1 may communicate with each other using the Separate Command Address (SCA) protocol.

The non-volatile memory device 300_1 may include first to ninth pins P11 to P19, a memory interface circuit 310, a control logic circuit 320, and a memory cell array 330.

The storage controller 200 may include first to ninth pins P21 to P29 and the controller interface circuit 212. The first to ninth pins P21 to P29 may correspond to the first to ninth pins P11 to P19 of the non-volatile memory device 300_1.

The controller interface circuit 212 may transmit, transfer, or send a chip enable signal nCE to the non-volatile memory device 300_1 through the first pin P21, and the memory interface circuit 310 may receive the chip enable signal nCE from the storage controller 200 through the first pin P11. The controller interface circuit 212 may transmit, transfer, or send and receive signals to and from the non-volatile memory device 300_1, which is selected from among a plurality of connected memory devices through the chip enable signal nCE, through the second to ninth pins P22 to P29, and the memory interface circuit 310 may transmit, transfer, or send and receive signals to and from the storage controller 200 through the second to ninth pins P12 to P19 according to the chip enable signal nCE. For example, if the chip enable signal nCE is in an enable state (e.g., a low level), the memory interface circuit 310 may transmit, transfer, or send and receive signals to and from the storage controller 200 through the second to ninth pins P12 to P19.

The controller interface circuit 212 may transmit, transfer, or send a command latch enable signal CLE, an address latch enable signal ALE, and a command/address clock signal CA_clk to the non-volatile memory device 300_1 through the second to fourth pins P22 to P24, and the memory interface circuit 310 may receive the command latch enable signal CLE, the address latch enable signal ALE, and the command/address clock signal CA_clk through the second to fourth pins P12 to P14.

The memory interface circuit 310 may receive the command CMD and the address ADDR from the storage controller 200. For example, the controller interface circuit 212 may transmit, transfer, or send a write enable signal WEB to the memory interface circuit 310 through the sixth pin P26, and the memory interface circuit 310 may receive the write enable signal WEB from the storage controller 200 through the sixth pin P16. Based on toggle timings of the write enable signal WEB, the memory interface circuit 310 may acquire the command CMD and/or the address ADDR through the second pin P12 and the third pin P13 according to the command/address clock signal CA_clk. The line connecting the second pin P12 and the third pin P13 of the memory interface circuit 310 and the second pin P22 and the third pin P23 of the controller interface circuit 212, for example, the line through which the command CMD and the address ADDR are transmitted, transferred, or sent to the memory interface circuit 310 may be referred to herein as a command/address (CA) line.

The controller interface circuit 212 may transmit, transfer, or send a read enable signal REB through the fifth pin P25, and the memory interface circuit 310 may receive the read enable signal REB through the fifth pin P15. In response to receiving the read enable signal REB, the memory interface circuit 310 may receive the data strobe signal DQS from the storage controller 200 through the seventh pin P17, or transmit, transfer, or send the data strobe signal DQS to the storage controller 200.

The controller interface circuit 212 may transmit, transfer, or send the data signal DQ to the non-volatile memory device 300_1, or receive the data signal DQ from the non-volatile memory device 300_1 through the eighth pin P28. Based on the toggle timing of the data strobe signal DQS, the memory interface circuit 310 may receive the data signal DQ from the storage controller 200 through the eighth pin P18 or transmit, transfer, or send the data signal DQ to the storage controller 200. The data DATA may be transferred or sent through the data signal DQ.

For example, the data signal DQ may be transferred or sent through a plurality of data lines connecting the eighth pin P18 of the memory interface circuit 310 and the eighth pin P28 of the controller interface circuit 212. The eighth pin P18 may include a plurality of pins (e.g., eight data pins) corresponding to a plurality of data signals, which will be described below in detail with reference to FIGS. 6A to 6C.

The memory interface circuit 310 may transmit, transfer, or send a ready/busy output signal nR/B to the storage controller 200 through the ninth pin P19, and the controller interface circuit 212 may receive the ready/busy output signal nR/B through the ninth pin P29. The memory interface circuit 310 may transmit, transfer, or send state information of the non-volatile memory device 300_1 to the storage controller 200 through the ready/busy output signal nR/B.

In some example embodiments, if the non-volatile memory device 300_1 is in the busy state (e.g., if internal operations of the non-volatile memory device 300_1 are being performed), the memory interface circuit 310 may transmit, transfer, or send the ready/busy output signal nR/B indicating a busy state to the storage controller 200. For example, the memory interface circuit 310 may transmit, transfer, or send the ready/busy output signal nR/B indicating the busy state to the storage controller 200 while the non-volatile memory device 300_1 is programming the data DATA to the memory cell array 330 in response to a program command or reading the data DATA from the memory cell array 330 in response to a page read command.

In some example embodiments, if the non-volatile memory device 300_1 is in the ready state (e.g., if the internal operations of the non-volatile memory device 300_1 are not performed or are completed), the memory interface circuit 310 may transmit, transfer, or send the ready/busy output signal nR/B indicating a ready state to the storage controller 200.

The controller interface circuit 212 may determine the state information of the non-volatile memory device 300_1 based on the ready/busy output signal nR/B.

The control logic circuit 320 may control various operations of the non-volatile memory device 300_1 as a whole. The control logic circuit 320 may receive the command/address CMD/ADDR acquired from the memory interface circuit 310. The control logic circuit 320 may generate control signals for controlling other components of the non-volatile memory device 300_1 according to the received command/address CMD/ADDR. For example, the control logic circuit 320 may generate various control signals for programming the data DATA in the memory cell array 330 or reading data DATA from the memory cell array 330. In some example embodiments, the control logic circuit 320 may also generate control signals for adjusting a channel potential within the memory cell array.

The control logic circuit 320 may receive a command CMD including a specific, or alternatively desired data pattern, store a data pattern corresponding to the data pattern included in the command CMD in a register in the non-volatile memory device 300_1 based on the command CMD, and control the register to transmit, transfer, or send the data pattern stored in the register to the storage controller 200 or to a logic circuit in the non-volatile memory device 300_1.

The memory cell array 330 may store the data DATA acquired from the memory interface circuit 310 under the control of the control logic circuit 320. The memory cell array 330 herein may output the stored data DATA to the memory interface circuit 310 under the control of the control logic circuit 320. In some example embodiments, the memory cell array 330 may adjust the channel potential in the memory cell array 330 under the control of the control logic circuit 320.

The memory cell array 330 may include a plurality of memory cells. For example, a plurality of memory cells may be flash memory cells. However, example embodiments are not limited thereto, and, in some example embodiments, the memory cells may be resistive random access memory (RRAM) cells, ferroelectric random access memory (FRAM) cells, phase change random access memory (PRAM) cells, thyristor random access memory (TRAM) cells, and magnetic random access memory (MRAM) cells.

The controller interface circuit 212 and the memory interface circuit 310 illustrated and described with reference to FIG. 4 are examples and example embodiments of the present inventive concepts are not limited thereto. For example, the controller interface circuit 212 and the memory interface circuit 310 may further include pins that transmit, transfer, or send and receive signals different from those illustrated and described with reference to FIG. 4. In some example embodiments, some of the plurality of pins P11 to P19 of the memory interface circuit 310 may be omitted from the memory interface circuit 310 or integrated with other pins and some of the plurality of pins P21 to P29 of the controller interface circuit 212 may be omitted from the controller interface circuit 212 or may be integrated with other pins.

Figure 5:
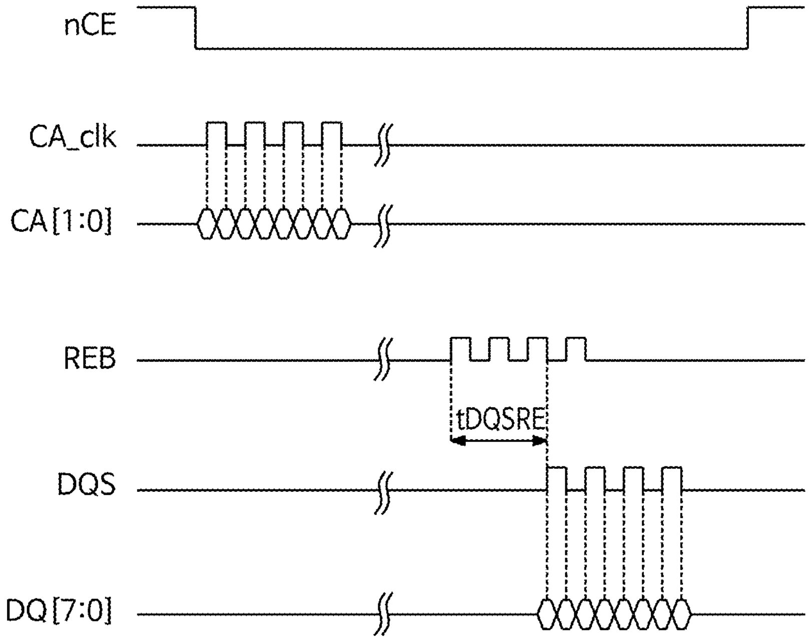
FIG. 5 is a diagram illustrating signals transmitted or sent and received between the controller interface circuit and the memory interface circuit of FIG. 4 according to some example embodiments.

FIG. 5 is a diagram illustrating signals transmitted, transferred, or sent and received between the controller interface circuit 212 and the memory interface circuit 310 of FIG. 4, according to some example embodiments. Signal CA[1:0] illustrated in FIG. 5 may correspond to the command latch enable signal CLE and the address latch enable signal ALE of FIG. 4, and signal DQ[7:0] may correspond to the signal DQ of FIG. 4.

In some example embodiments, if the chip enable signal nCE is in an enable state (e.g., a low level), the memory interface circuit 310 may acquire the command CMD and the address ADDR by sampling the signal CA[1:0] received through the command/address (CA) line at the rising and falling edges of the command/address clock signal CA_clk.

In some example embodiments, in the data DATA output operation of the non-volatile memory device 300_1, the controller interface circuit 212 may generate a toggling read enable signal REB, and the memory interface circuit 310 may receive the read enable signal REB before (e.g., prior to) outputting the data DATA. For example, before the data DATA is output, the controller interface circuit 212 may generate the read enable signal REB that changes from a fixed state (e.g., a high level or a low level) to a toggle state.

The memory interface circuit 310 may generate the data strobe signal DQS that toggles based on toggling of the read enable signal REB. For example, the memory interface circuit 310 may generate a data strobe signal DQS that starts toggling after a predetermined, or alternatively desired delay (e.g., tDQSRE) from a toggling start time of the read enable signal REB.

The memory interface circuit 310 may transmit, transfer, or send the data signal DQ including the data DATA based on the toggle timing of the data strobe signal DQS. Accordingly, the data DATA may be aligned with the toggle timing of the data strobe signal DQS and transmitted, transferred, or sent to the storage controller 200.

According to some example embodiments, in the data DATA input operation of the non-volatile memory device 300_1, if the data signal DQ including the data DATA is received from the storage controller 200, the memory interface circuit 310 may receive the data strobe signal DQS that toggles with the data DATA from the storage controller 200. The memory interface circuit 310 may acquire the data DATA from the data signal DQ based on the toggle timing of the data strobe signal DQS. For example, the memory interface circuit 310 may acquire the data DATA by sampling the data signal DQ at a rising edge and a falling edge of the data strobe signal DQS.

Figure 6A:
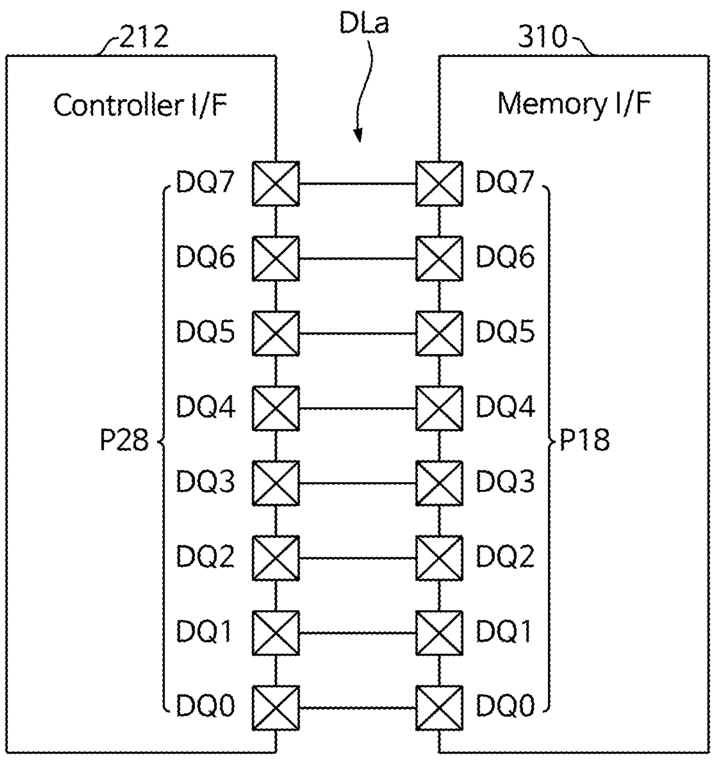
FIGS. 6A to 6C are diagrams illustrating a connection structure between the plurality of first data pins and the plurality of second data pins according some example embodiments of the present inventive concepts.
Figure 6B:
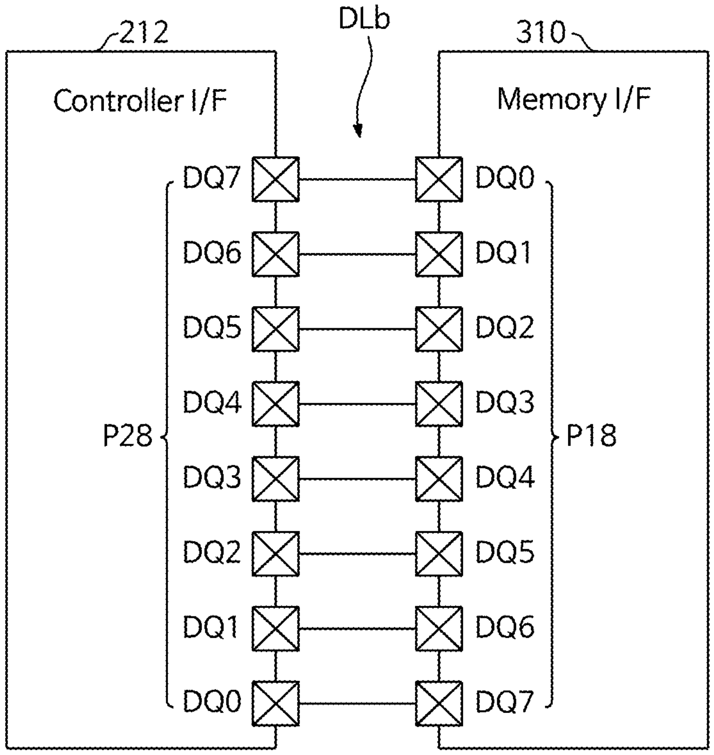
Figure 6C:
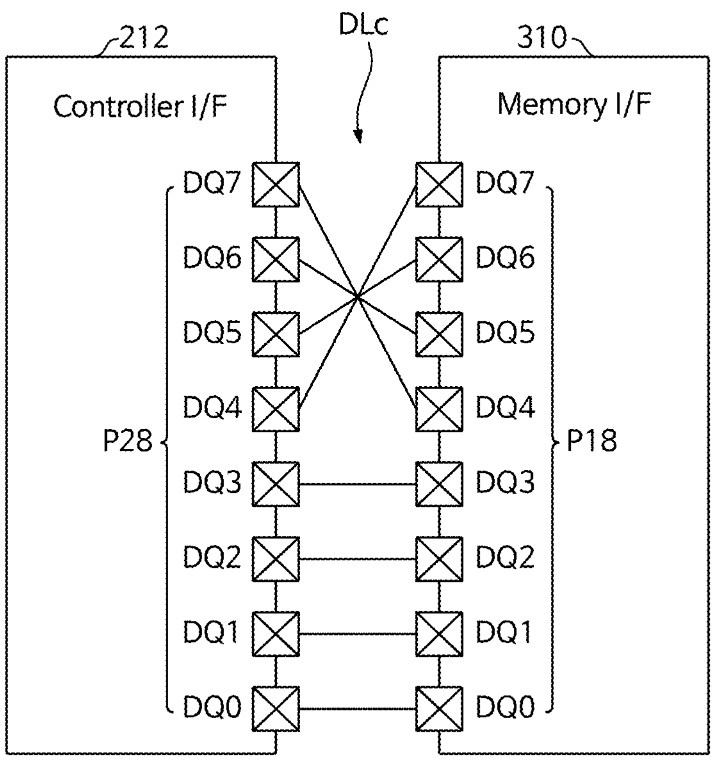

FIGS. 6A to 6C are diagrams illustrating a connection structure between the plurality of first data pins P28 and the plurality of second data pins P18 according to some example embodiments of the present inventive concepts. FIGS. 6A to 6C illustrate that the controller interface circuit 212 includes eight first data pins P28 and the memory interface circuit 310 includes eight second data pins P18, but example embodiments are not limited thereto. For example, each of the controller interface circuit 212 and the memory interface circuit 310 may include 16 data pins.

In FIGS. 6A to 6C, the plurality of first data pins P28 may be connected to the plurality of second data pins P18 through a plurality of data lines DLa, DLb, and DLc. The connection structure between the plurality of first data pins P28 and the plurality of second data pins P18 may include various connection relationships to reduce or mitigate interference between data lines and improve signal integrity (SI). Hereinafter, a connection structure between the plurality of first data pins P28 and the plurality of second data pins P18 will be described with reference to FIGS. 6A to 6C.

Referring to FIG. 6A, in some example embodiments, if specific data is transmitted, transferred, or sent from one of the controller interface circuit 212 and the memory interface circuit 310 to the other, the plurality of first data pins P28 and the plurality of second data pins P18 may be connected such that the arrangement of data signals in the data before (e.g., prior to) transmission or sending is maintained in the data after transmission or sending of the data.

For example, the data arranged in order from a first data signal DQ[0] to an eighth data signal DQ[7] may be transmitted, transferred, or sent from one of the controller interface circuit 212 and the memory interface circuit 310, and in response, the other one of the controller interface circuit 212 and the memory interface circuit 310 may receive the data arranged in order from the first data signal DQ[0] to the eighth data signal DQ[7]. For example, if the data signals input to the plurality of data lines DLa are 00001111 in binary, the data signals output from the data line DLa may also be 00001111, identical to the input.

Referring to FIG. 6B, in some example embodiments, the plurality of first data pins P28 and the plurality of second data pins P18 may be connected such that, if specific data is transmitted, transferred, or sent from one of the controller interface circuit 212 and the memory interface circuit 310 to the other, the arrangement of the data signals in the data after transmission or sending of the data is in reverse order from the arrangement of the data signals in the data before transmission or sending of the data.

For example, in response to the transmission or sending of the data arranged in order from the first data signal DQ[0] to the eighth data signal DQ[7] from one of the controller interface circuit 212 and the memory interface circuit 310, the other one of the controller interface circuit 212 and the memory interface circuit 310 may receive the data arranged in order from the eighth data signal DQ[7] to the first data signal DQ[0]. For example, if the data signal input to the plurality of data lines DLb is 00001111 in binary, the data output from the data line DLb may be 11110000.

Example embodiments are not limited to FIG. 6B, and, in some example embodiments, the plurality of first data pins P28 and the plurality of second data pins P18 may also be connected in any structure in which the arrangement of data signals in data after transmission or sending of the data is changed and differs from the arrangement of data signals in data before transmission or sending of the data.

For example, referring to FIG. 6C, in response to the transmission or sending of the data arranged in order from the first data signal DQ[0] to the eighth data signal DQ[7], data arranged in order from the first data signal DQ[0] to the fourth data signal DQ[3] and from the eighth data signal DQ[7] to the fifth data signal DQ[4] may be received. For example, if the data signals input to the plurality of data lines DLc from the controller interface circuit 212 are 10101010 in binary, the data received by the memory interface circuit 310 may be 10100101.

As the plurality of first data pins P28 and the plurality of second data pins P18 are connected in any connection structure, the data transmitted, transferred, or sent between the storage controller 200 and the non-volatile memory device 300_1 and the data received in response may be different from each other. Therefore, in order to match the transmitted, transferred, or sent data with the received data, it is, or may be, necessary, desirable, or advantageous to change the arrangement of data signals in the data to be transmitted, transferred, or sent in advance before transmitting, transferring, or sending the same, or change the arrangement of data signals in the transmitted, transferred, or sent or received data. In order to match the transmitted, transferred, or sent data with the received data, it is necessary, desirable, or advantageous to acquire information associated with the physical connection structure between the plurality of first data pins P28 and the plurality of second data pins P18 using a specific logic in the storage device 100 and change the arrangement of data signals based on the acquired information, and this, according to some example embodiments, will be described below in detail with reference to FIGS. 7 to 11.

FIGS. 7A to 7D are diagrams illustrating detailed configurations of the storage controller 200 and the non-volatile memory device 300_1 according to some example embodiments of the present inventive concepts. A pattern generator 710 may generate a first data pattern DP1 for determining a connection structure between the plurality of first data pins P28 and the plurality of second data pins P18. The pattern generator 710 may be implemented in hardware and/or software. For example, the pattern generator 710 may include, may be included in, and/or may be implemented by one or more instances of processing circuitry; hardware/software combination such as a processor executing software; or a combination thereof. For example, the processing circuitry may include a processor and a memory storing a program of instructions, and the processor may be configured to execute the program of instructions to implement the functionality and/or methods performed by the pattern generator 710.

The first data pattern DP1 generated by the pattern generator 710 may be included in the command CMD, and the command CMD may be transferred or sent from the storage controller 200 to the non-volatile memory device 300_1 through the command/address line. The command CMD may be transferred or sent through a separate command/address line other than the data line such that the first data pattern DP1 in the command CMD may be transferred or sent to the non-volatile memory device 300_1 without being rearranged. The command CMD may be a read training command for performing a read training operation on the non-volatile memory device 300_1.

In response to receiving the command CMD including the first data pattern DP1, the control logic circuit 320 of the non-volatile memory device 300_1 may generate a second data pattern DP2 corresponding to the first data pattern DP1 based on the command CMD. For example, the second data pattern DP2 may be the same as the first data pattern DP1, or may be a pattern arranged in the reverse order from the first data pattern DP1. For example, if the first data pattern DP1 is 00001111 in binary, the second data pattern DP2 may be 00001111 or 11110000.

The pattern generator 710 may determine the second data pattern DP2 generated by the non-volatile memory device 300_1 based on the command CMD including the first data pattern DP1. In other words, the pattern generator 710 may predict or determine the second data pattern DP2 without having to receive the information associated with the second data pattern DP2 from the non-volatile memory device 300_1. Alternatively, in some example embodiments, the pattern generator 710 may be omitted from the storage controller 200, and the first data pattern DP1 and the second data pattern DP2 may be predetermined (or pre-stored) patterns. According to some example embodiments, the pattern generator 710 may be omitted from the storage controller 200, and the first data pattern DP1 and the second data pattern DP2 may be desired patterns.

Any one of the storage controller 200 and the non-volatile memory device 300_1 may transmit, transfer, or send the second data pattern DP2 using the plurality of data lines connecting the plurality of first data pins P28 and the plurality of second data pins P18, and in response to the transmission or sending of the second data pattern DP2, the other one of the storage controller 200 and the non-volatile memory device 300_1 may receive a third data pattern DP3. The third data pattern DP3 may be the same as or different from the second data pattern DP2 depending on the connection structure between the plurality of first data pins P28 and the plurality of second data pins P18.

A logic circuit 720 may receive the second data pattern DP2 and the third data pattern DP3. The logic circuit 720 may determine the connection structure between the plurality of first data pins P28 and the plurality of second data pins P18 based on the second data pattern DP2 and the third data pattern DP3. For example, the logic circuit 720 may compare the second data pattern DP2 with the third data pattern DP3 to determine the connection structure between the plurality of first data pins P28 and the plurality of second data pins P18. For example, if the first data pattern DP1 is transferred or sent through a separate command/address line, the data signal of the first data pattern DP1 is transferred or sent to the non-volatile memory device 300_1 without being rearranged. In some example embodiments, if the second data pattern DP2 is transferred or sent through the plurality of data lines, the data signal may be rearranged and transferred or sent, such that it is possible to specify the connection structure of the plurality of data lines by comparing the second data pattern DP2 generated from the first data pattern DP1 with the third data pattern DP3.

The logic circuit 720 may determine whether to activate a swap circuit 730 connected to the plurality of data lines based on the second data pattern DP2 and the third data pattern DP3. According to some example embodiments, when activated, the swap circuit 730 may change the signal arrangement of data input to the swap circuit 730. For example, the activated swap circuit 730 may change the arrangement of data signals within the data transmitted, transferred, or sent by either the storage controller 200 or the non-volatile memory device 300_1, or the arrangement of data signals within the data received by the other, such that the arrangement of data signals in the data transmitted, transferred, or sent from one of the storage controller 200 and the non-volatile memory device 300_1 matches the arrangement of data signals in the data received from the other in response. Accordingly, in some example embodiments, it is possible to determine/predict the connection method between the non-volatile memory device 300_1 and the storage controller 200 without requiring a separate pin to be additionally allocated to the storage device 100 to indicate the connection method, and accordingly, it is possible to prevent or reduce the size of the non-volatile memory device 300_1 and the storage controller 200 from being increased due to the addition of the separate pin. In addition, if a separate pin is used to indicate the connection method between the non-volatile memory device 300_1 and the storage controller 200, it may be difficult to apply various connection structures between the plurality of data pins, but according to some example embodiments of the present inventive concepts, various connection structures may be applied to reduce or mitigate interference between data lines and improve signal integrity (SI).

In some example embodiments, if the second data pattern DP2 and the third data pattern DP3 are the same as each other, it may be determined that the connection structure between the plurality of first data pins P28 and the plurality of second data pins P18 are the same as that of, e.g., FIG. 6A. For example, since the arrangement of the data signals in the data transmitted, transferred, or sent from one of the storage controller 200 and the non-volatile memory device 300_1 matches the arrangement of the data signals in each of the data received from the other in response, the logic circuit 720 may deactivate the swap circuit 730.

According to some example embodiments, if the second data pattern DP2 and the third data pattern DP3 are different, the logic circuit 720 may transmit, transfer, or send a swap enable signal SE for activating the swap circuit 730 to the swap circuit 730.

The swap circuit 730 may change in advance the arrangement of data signals in the data to be transmitted, transferred, or sent before transmitting, transferring, or sending the data signals or may change the arrangement of data signals in the received data so as to match the data transmitted, transferred, or sent between the storage controller 200 and the non-volatile memory device 300_1 with the data received in response.

The swap circuit 730 may be included in the storage controller 200 or may be included in the non-volatile memory device 300_1. A detailed operation of the swap circuit 730 included in the storage controller 200 according to some example embodiments will be described below in detail with reference to FIG. 13A. A detailed operation of the swap circuit 730 included in the non-volatile memory device 300_1 according to some example embodiments will also be described below in detail with reference to FIG. 13B.

Figure 7A:
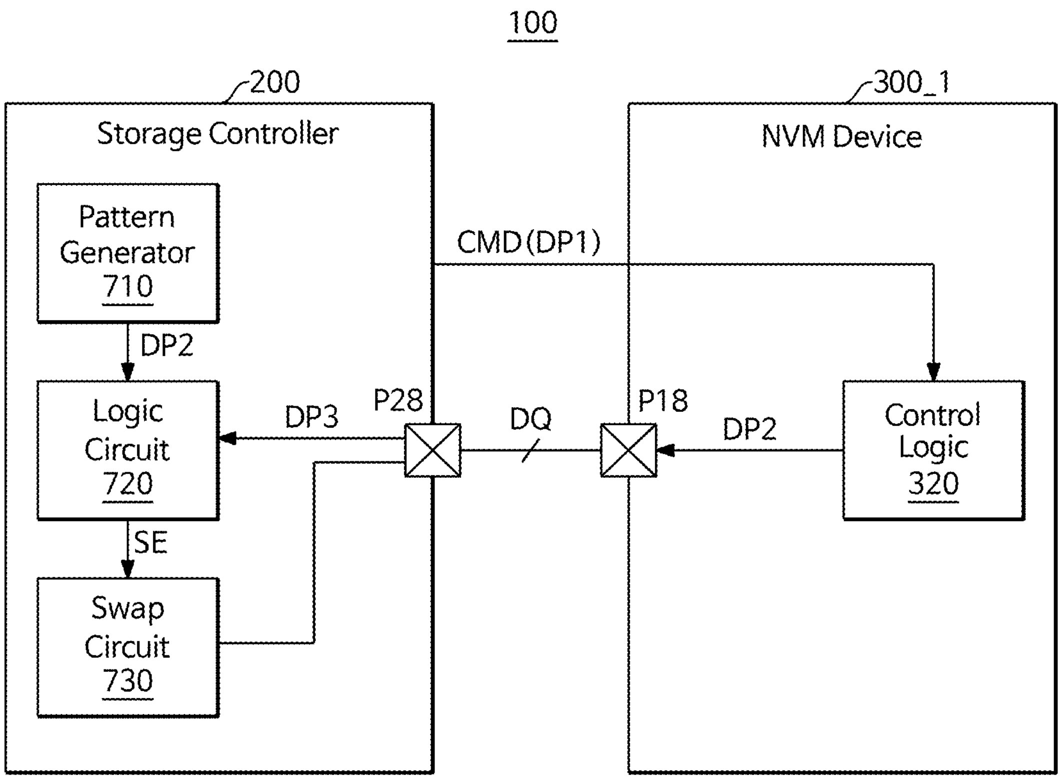
FIGS. 7A to 7D are diagrams illustrating detailed configurations of the storage controller and the non-volatile memory device according to some example embodiments of the present inventive concepts.

Referring to FIG. 7A, the pattern generator 710, the logic circuit 720, and the swap circuit 730 may be included in the storage controller 200. By including the logic circuit 720 in the storage controller 200, it is possible to determine the connection structure between the storage controller 200 and a plurality of memory devices connected thereto using the logic circuit 720, and the configuration of the storage device 100 can be simplified.

Figure 7B:
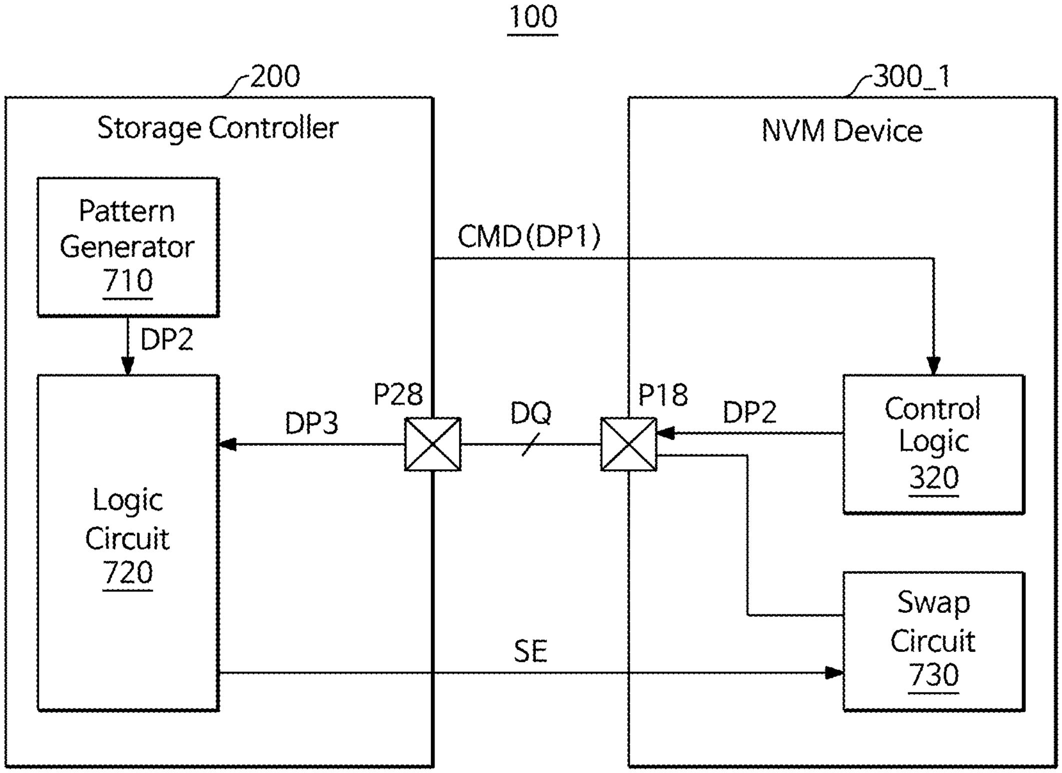

Referring to FIG. 7B, unlike FIG. 7A, the swap circuit 730 may be included in the non-volatile memory device 300_1.

Figure 7C:
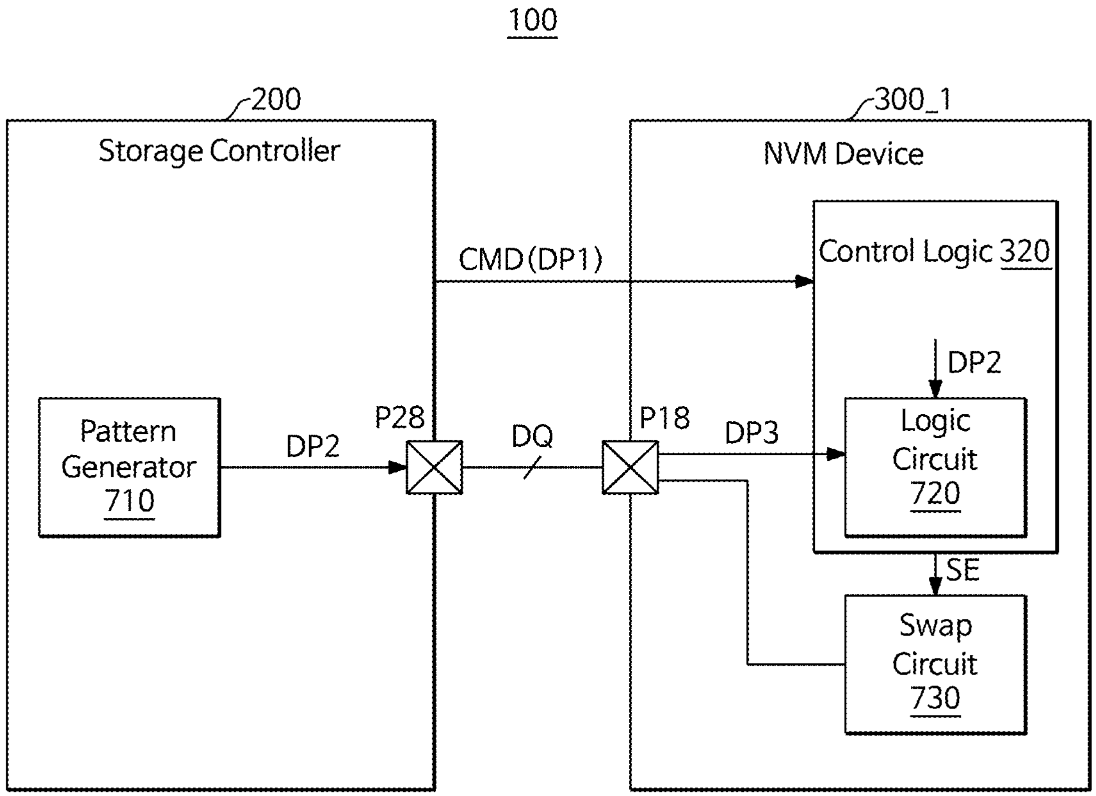

Referring to FIG. 7C, the pattern generator 710 may be included in the storage controller 200, and the logic circuit 720 and the swap circuit 730 may be included in the non-volatile memory device 300_1. In some example embodiments, the logic circuit 720 may be included in the control logic circuit 320. Alternatively, in some example embodiments, the logic circuit 720 may be configured as a separate circuit from the control logic circuit 320.

Figure 7D:
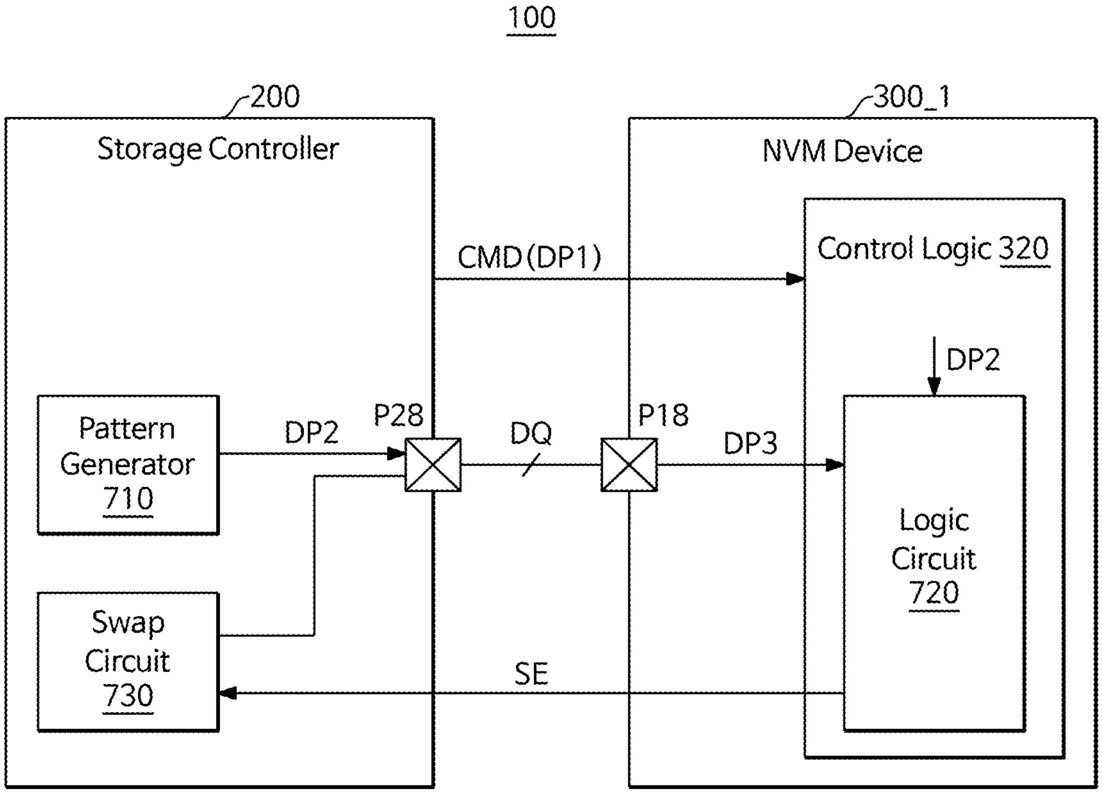

Referring to FIG. 7D, unlike FIG. 7C, the swap circuit 730 may be included in the storage controller 200.

Figure 8A:
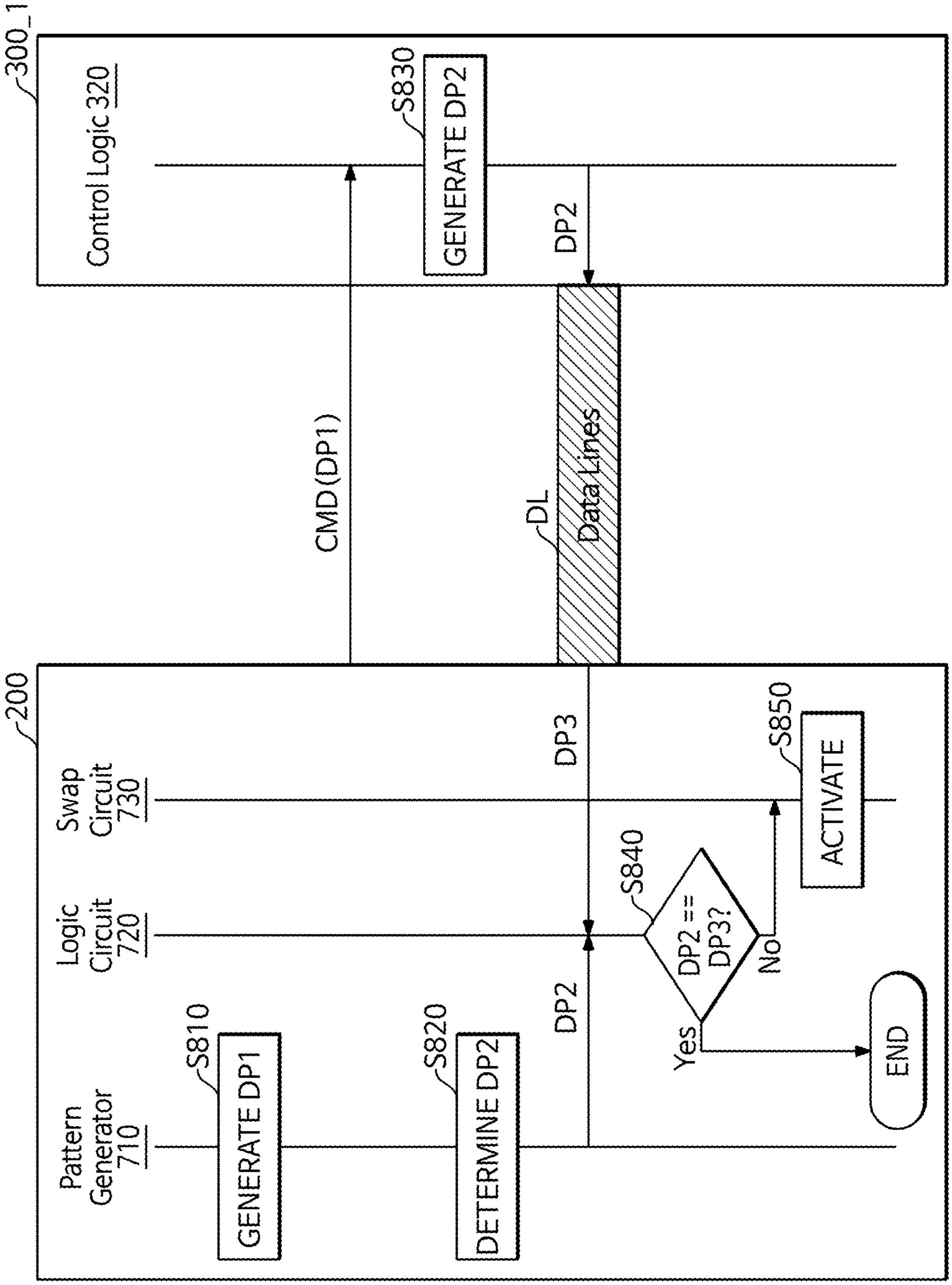
FIG. 8A is a diagram illustrating an example in which the swap circuit is activated using the storage controller and the non-volatile memory device according to FIG. 7A, according to some example embodiments.
Figure 8B:
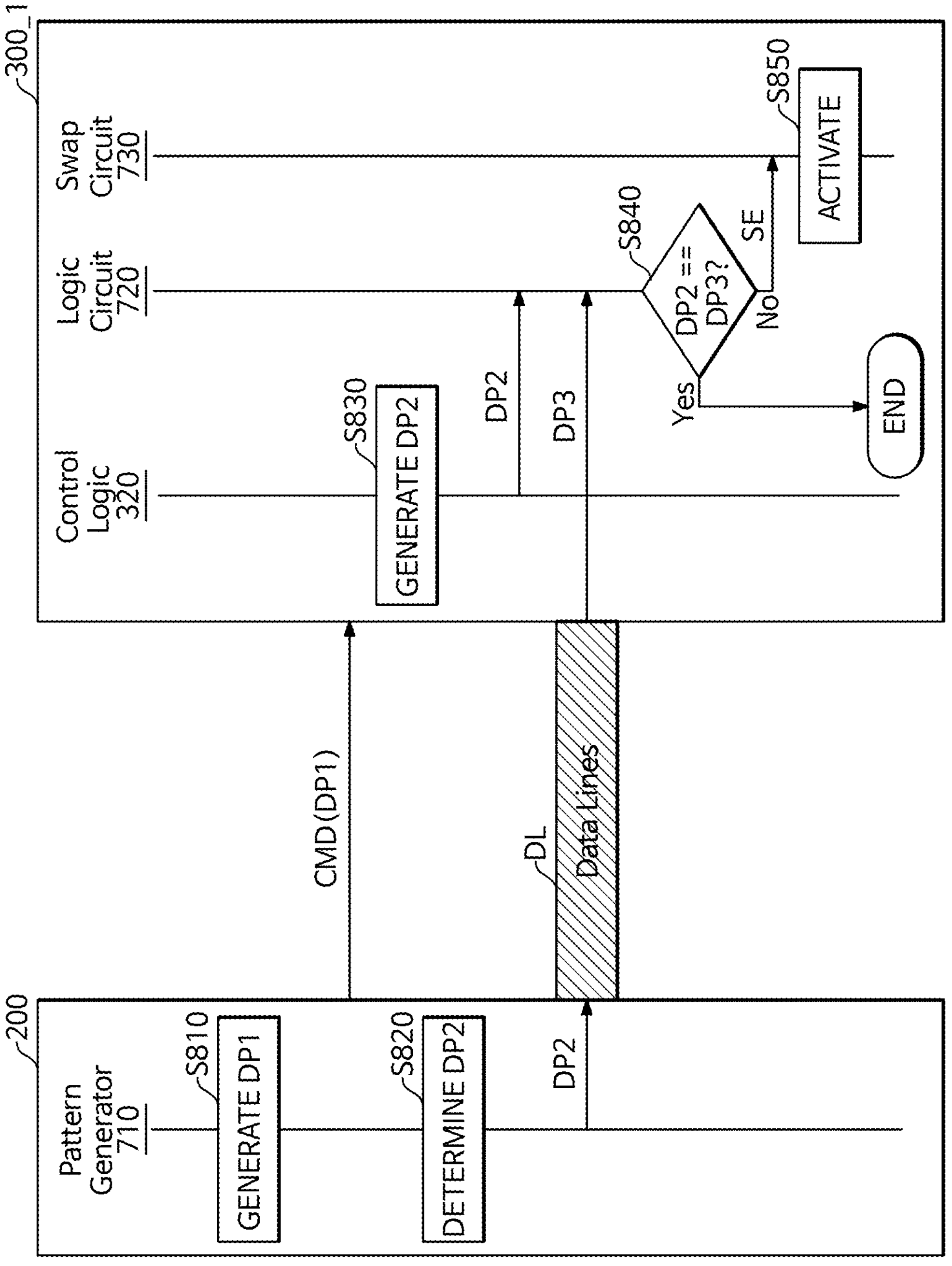
FIG. 8B is a diagram illustrating an example in which the swap circuit is activated using the storage controller and the non-volatile memory device according to FIG. 7C, according to some example embodiments.

FIG. 8A is a diagram illustrating an example in which the swap circuit 730 is activated using the storage controller 200 and the non-volatile memory device 300_1 according to FIG. 7A, according to some example embodiments, and FIG. 8B is a diagram illustrating an example in which the swap circuit 730 is activated using the storage controller 200 and the non-volatile memory device 300_1 according to FIG. 7C, according to some example embodiments. Note that the order of the operations and arrows illustrated in FIGS. 8A and 8B are not intended to limit the temporal order of each operation or any specific operation.

The pattern generator 710 may generate the first data pattern DP1, at S810. The pattern generator 710 may determine (or, decide) the second data pattern DP2 to be generated in the non-volatile memory device 300_1 based on the command CMD, at S820.

The storage controller 200 may generate the command CMD including the first data pattern DP1 and transmit, transfer, or send the command CMD to the non-volatile memory device 300_1. The control logic circuit 320 of the non-volatile memory device 300_1 may generate the second data pattern DP2 based on the command CMD, at S830.

The logic circuit 720 may determine whether the second data pattern DP2 and the third data pattern DP3 transferred or sent through the data line DL match each other, at S840.

Referring to FIG. 8A, the logic circuit 720 may be included in the storage controller 200 and may determine whether the second data pattern DP2 generated by the pattern generator 710 and the third data pattern DP3 received from the non-volatile memory device 300_1 match each other.

Referring to FIG. 8B, the logic circuit 720 may be included in the non-volatile memory device 300_1 and may determine whether the second data pattern DP2 generated by the control logic circuit 320 and the third data pattern DP3 received from the storage controller 200 match each other.

In some example embodiments, if the second data pattern DP2 and the third data pattern DP3 match each other, the logic circuit 720 may maintain the swap circuit 730 in the inactive state. In some example embodiments, if the second data pattern DP2 and the third data pattern DP3 are different from each other, the logic circuit 720 may transmit, transfer, or send the swap enable signal SE to the swap circuit 730 to activate the swap circuit 730, at S850.

FIGS. 9 to 11 are diagrams illustrating examples of the second data pattern DP2 and the third data pattern DP3 of FIGS. 7A to 7D according to some example embodiments.

FIG. 9 will be described based on the assumption that the plurality of first data pins P28 and the plurality of second data pins P18 are connected either in the same order or in the reverse order as illustrated in, e.g., FIGS. 6A and 6B.

As illustrated in FIG. 9, in some example embodiments, the second data pattern DP2 may be the reverse arrangement of the first data pattern DP1. In some example embodiments, the second data pattern DP2 may be the same as the first data pattern DP1.

The first data pattern DP1, the second data pattern DP2, and the third data pattern DP3 of FIG. 9 may include the same number of bits as a number (e.g., 8) of the plurality of data lines connecting the plurality of first data pins P28 and the plurality of second data pins P18.

In some example embodiments, if the second data pattern DP2 and the third data pattern DP3 are the same as shown in the first example 910, it may be determined that the plurality of first data pins P28 and the plurality of second data pins P18 are connected to each other in the same order as in the connection structure illustrated in, e.g., FIG. 6A.

Alternatively, in some example embodiments, e.g., in the second example 920, if the second data pattern DP2 and the third data pattern DP3 are different from each other (or, if the third data pattern DP3 is a pattern where the second data pattern DP2 is arranged in reverse order), it may be determined that the plurality of first data pins P28 and the plurality of second data pins P18 are connected to each other in reverse order, as in the connection structure illustrated in, e.g., FIG. 6*b*.

FIG. 10 illustrates examples of the second data pattern DP2 and the third data pattern DP3, each including a plurality of different patterns (1st pattern to 8th pattern), according to some example embodiments.

The examples of the second data pattern DP2 illustrated in FIG. 10 may be used to determine the connection structure when the plurality of first data pins P28 and the plurality of second data pins P18 are connected to each other in any arbitrary connection structure, in addition to being connected in the same order or in the reverse order as illustrated in FIG. 6A or FIG. 6B. The third data pattern DP3 of FIG. 10 is illustrated and described based on the connection structure illustrated in, e.g., FIG. 6C.

Each of the plurality of patterns (1st pattern to 8th pattern) may include the same number of bits as the number of the plurality of data lines. For example, any one of the same number of bits as the number of the plurality of data lines may be a first bit (e.g., "1" bit), and bits other than the one of the same number of bits as the number of the plurality of data lines may be second bits (e.g., "0" bits), which are opposite bits of the first bit.

For example, in response to the transmission or sending of pattern "10000000" as a part of the second data pattern DP2, pattern "10000000" may be received as a part of the third data pattern DP3 (1st pattern). Accordingly, it may be confirmed that the plurality of data lines receive the first data signal DQ[0] and output it as the first data signal DQ[0].

In some example embodiments, in response to the transmission or sending of pattern "00001000" as a part of the second data pattern DP2, pattern "00000001" may be received as a part of the third data pattern DP3 (5th pattern). Accordingly, it may be confirmed that the plurality of data lines receive the fifth data signal DQ[4] and output it as the eighth data signal DQ[7].

For example, by comparing the second data pattern DP2 with the third data pattern DP3, it is possible to determine the connection structure between the plurality of first data pins P28 and the plurality of second data pins P18, which receives i-th data signal DQ[i−1] and outputs it as j-th data signal DQ[j−1] (note that each of i and j is a natural number that is less than or equal to the number of the plurality of data lines).

The number of different patterns (1st pattern to 8th pattern) included in each of the second data pattern DP2 and the third data pattern DP3 may be the same as the number of the plurality of data lines. For example, each of the plurality of patterns (1st pattern to 8th pattern) may be used to specify the data pin to which each of the plurality of data lines is connected.

Alternatively, in some example embodiments, the number of different patterns (1st pattern to 8th pattern) may be one less than the number of data lines. For example, any one (e.g., 8th pattern) of the plurality of different patterns (1st pattern to 8th pattern) of FIG. 10 may be omitted. This is possible because the plurality of first data pins P28 and the plurality of second data pins P18 are in a one-to-one correspondence relationship, and therefore, if the connection relationships of all of the plurality of data lines are determined except for one, the connection relationship of the remaining data line can also be determined.

FIG. 11 illustrates examples of the second data pattern DP2 and the third data pattern DP3 including unique identification patterns ID0 to ID7 representing each of the plurality of data signals DQ[0] to DQ[7] according to some example embodiments. The examples of the second data pattern DP2 illustrated in FIG. 11 may be used to determine the connection structure when the plurality of first data pins P28 and the plurality of second data pins P18 are connected to each other in any connection structure other than the connection structures illustrated in, e.g., FIG. 6A or 6B in which the data pins are connected to each other in the same order or in the reverse order. The third data pattern DP3 of FIG. 11 is illustrated and described based on the connection structure illustrated in, e.g., FIG. 6C.

Each of the unique identification patterns ID0 to ID7 may include a sequence of bits included in one column in the table of FIG. 11. For example, in the second data pattern DP2 illustrated in FIG. 11, "000" may be the first unique identification pattern ID0 indicating the first data signal DQ[0] of the second data pattern DP2, "001" may be the second unique identification pattern ID1 indicating the second data signal DQ[1], and "111" may be the eighth unique identification pattern ID7 indicating the eighth data signal DQ[7].

The second data pattern DP2 may be transmitted, transferred, or sent as each of the plurality of patterns (1st pattern to 3rd pattern) are sequentially transmitted, transferred, or sent, and in response, each of the plurality of patterns (1st pattern to 3rd pattern) of the third data pattern DP3 may be sequentially received. Accordingly, the third data pattern DP3 may include the unique identification patterns ID0 to ID7 from the second data pattern DP2. For example, the first unique identification pattern ID0, for example, "000" may be received as the first data signal DQ[0] of the third data pattern DP3, the fifth unique identification pattern ID4 from the second data pattern DP2, for example, "100" may be received as the eighth data signal DQ[7] of the third data pattern DP3, and the sixth unique identification pattern ID5 from the second data pattern DP2, for example, "101" may be received as the seventh data signal DQ[6] of the third data pattern DP3. In other words, by comparing the unique identification patterns expressed by the plurality of bits received through one data pin, it is possible to determine which data signal in the third data pattern DP3 corresponds to a specific data signal from the second data pattern DP2. Accordingly, the connection structure of the plurality of first data pins P28 and the plurality of second data pins P18 may be determined.

The number of the plurality of patterns (1st pattern to 3rd pattern) of the second data pattern DP2 and the third data pattern DP3 may be determined based on Mathematical Expression 1 below.

$$x \geq \log_2 n \qquad \text{< Mathematical Expression 1 >}$$

where, x is the number of the plurality of patterns, and n is the number of data lines. For example, the second data pattern DP2 and the third data pattern DP3 may include a plurality of patterns that are equal to or greater in number than the minimum number of bits required to assign different unique identification patterns to each of the plurality of data signals DQ[0] to DQ[7].

The second data pattern DP2 and the third data pattern DP3 illustrated in, e.g., FIGS. 9 to 11 are only examples for description, and example embodiments of the present inventive concepts are not limited thereto. For example, it is illustrated that a plurality of patterns of each of the second data pattern DP2 and the third data pattern DP3 are separated from each other, but example embodiments are not limited thereto. For example, each of the second data pattern DP2 and the third data pattern DP3 illustrated in, e.g., FIG. 10 may include 64 consecutive bits, and may be transmitted, transferred, or sent and received in 8-bit units through the plurality of data lines. In some example embodiments, the second data pattern DP2 and the third data pattern DP3 illustrated and described with reference to, e.g., FIGS. 9 to 11 may further include specific, or alternatively desired data, and the second data pattern DP2 and the third data pattern DP3 illustrated and described with reference to, e.g., FIGS. 9 to 11 may represent the minimum data necessary or advantageous to determine the connection structure between the plurality of first data pins P28 and the plurality of second data pins P18.

Figure 12:
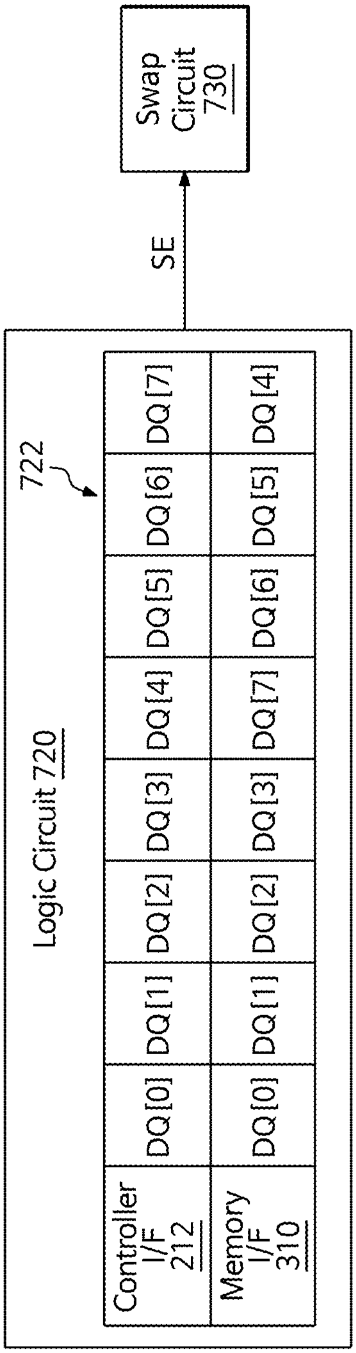
FIG. 12 is a diagram illustrating an example in which the swap enable signal is transferred or sent to the swap circuit according to some example embodiments.

FIG. 12 is a diagram illustrating an example in which the swap enable signal SE is transferred or sent to the swap circuit 730 according to some example embodiments. The logic circuit 720 may determine the connection structure between the plurality of first data pins P28 and the plurality of second data pins P18, and generate information (or signals) associated with the determined connection structure. Table 722 illustrated in FIG. 12 illustrates an example of information associated with the determined connection structure. For example, according to table 722, the fifth data signal DQ[4] transmitted, transferred, or sent from the controller interface circuit 212 may be received at the memory interface circuit 310 as the eighth data signal DQ[7].

The logic circuit 720 may generate information associated with a method for the swap circuit 730 to change the arrangement of the data signal based on the determined connection structure. The information associated with the method for the swap circuit 730 to change the arrangement of the data signal may be included in the swap enable signal SE and transferred or sent. For example, the logic circuit 720 may transfer or send the swap enable signal SE, and accordingly, the swap circuit 730 may be activated and the method for the swap circuit 730 to change the arrangement of the data signals may be determined. Alternatively, in some example embodiments, the information associated with the method for the swap circuit 730 to change the arrangement of the data signal may be transferred or sent as a separate signal from the swap enable signal SE.

The activated swap circuit 730 may change the arrangement of data signals in the data input to the swap circuit 730 such that the arrangement of data signals in the data transmitted, transferred, or sent from either the controller interface circuit 212 or the memory interface circuit 310 matches the arrangement of data signals in the data received from the other in response.

Figure 13A:
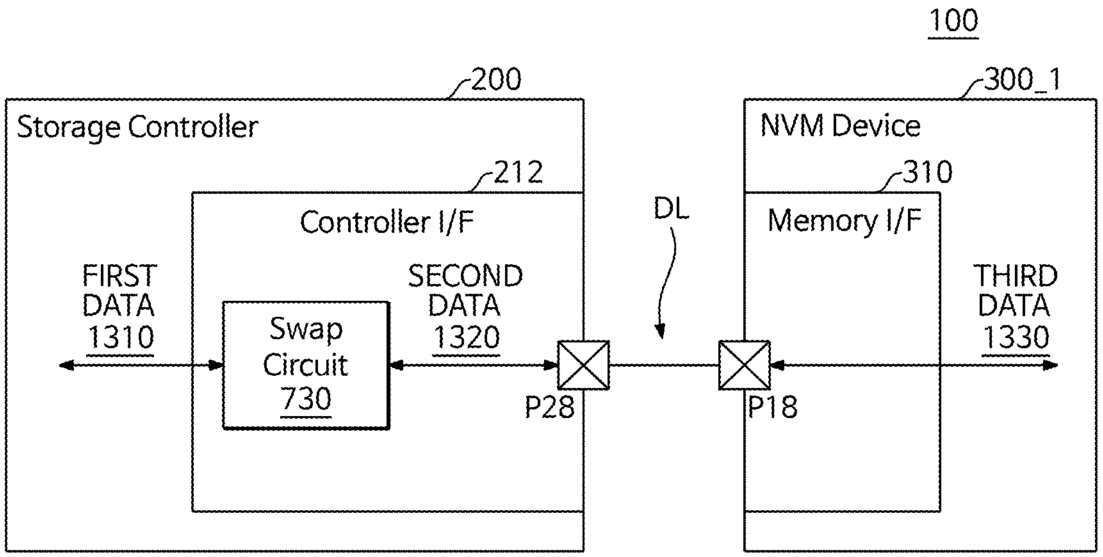
FIGS. 13A and 13B are diagrams provided to explain operations of the activated swap circuit according to some example embodiments.
Figure 13B:
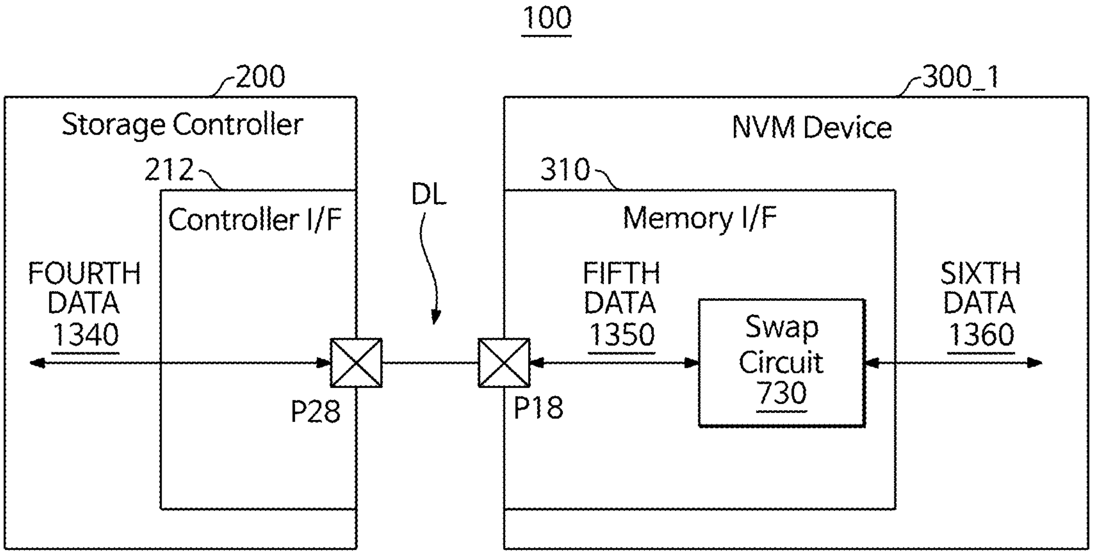

FIGS. 13A and 13B are diagrams provided to explain operations of the activated swap circuit 730 according to some example embodiments.

Referring to FIG. 13A, the swap circuit 730 may be included in the storage controller 200. For example, the swap circuit 730 may be included in the controller interface circuit 212 of the storage controller 200.

According to some example embodiments, when it is assumed that first data 1310 is transmitted, transferred, or sent from the storage controller 200 to the non-volatile memory device 300_1, the swap circuit 730 may receive the first data 1310 to be transmitted, transferred, or sent to the non-volatile memory device 300_1, and may output second data 1320, with the arrangement of data signals changed from the arrangement of data signals included in the first data 1310, through the plurality of first data pins P28. The non-volatile memory device 300_1 may receive, through the plurality of data lines DL, third data 1330 with an arrangement of data signals changed from the arrangement of data signals included in the second data 1320. The swap circuit 730 may change the arrangement of data signals included in the first data 1310 such that the third data 1330 and the first data 1310 are the same as each other.

Alternatively, in some example embodiments, when it is assumed that the third data 1330 is transmitted, transferred, or sent from the non-volatile memory device 300_1 to the storage controller 200, the storage controller may receive, through the plurality of data lines DL, the second data 1320 with an arrangement of data signals changed from the arrangement of data signals included in the third data 1330, and the swap circuit 730 may receive the second data 1320 and output the first data 1310 with an arrangement of data signals changed from the arrangement of data signals included in the second data 1320. The swap circuit 730 may change the arrangement of data signals included in the second data 1320 such that the third data 1330 and the first data 1310 are the same as each other.

Referring to FIG. 13B, the swap circuit 730 may be included in the non-volatile memory device 300_1. For example, the swap circuit 730 may be included in the memory interface circuit 310 in the non-volatile memory device 300_1.

According to some example embodiments, when it is assumed that fourth data 1340 is transmitted, transferred, or sent from the storage controller 200 to the non-volatile memory device 300_1 through the plurality of first data pins P28, the non-volatile memory device 300_1 may receive, through the plurality of data lines DL, fifth data 1350 in which an arrangement of data signals has been changed from the arrangement of data signals included in the fourth data 1340 to be transmitted, transferred, or sent from the storage controller to the non-volatile memory device 300_1, and the swap circuit 730 may receive the fifth data 1350 and output sixth data 1360 in which an arrangement of data signals has been changed from the arrangement of data signals included in the fifth data 1350. The swap circuit 730 may change the arrangement of data signals included in the fifth data 1350 such that the fourth data 1340 and the sixth data 1360 are the same as each other.

Alternatively, in some example embodiments, when it is assumed that the sixth data 1360 is transmitted, transferred, or sent from the non-volatile memory device 300_1 to the storage controller 200, the swap circuit 730 may receive the sixth data 1360 to be transmitted, transferred, or sent from the non-volatile memory device 300_1 to the storage controller and output, to the plurality of second data pins P18, the fifth data 1350 with an arrangement of data signals changed from the arrangement of data signals included in the sixth data 1360, and the storage controller 200 may receive, through the plurality of data lines DL, the fourth data 1340 with an arrangement of data signals changed from the arrangement of data signals included in the fifth data 1350. The swap circuit 730 may change the arrangement of data signals included in the sixth data 1360 such that the fourth data 1340 and the sixth data 1360 are the same as each other.

Figure 14:
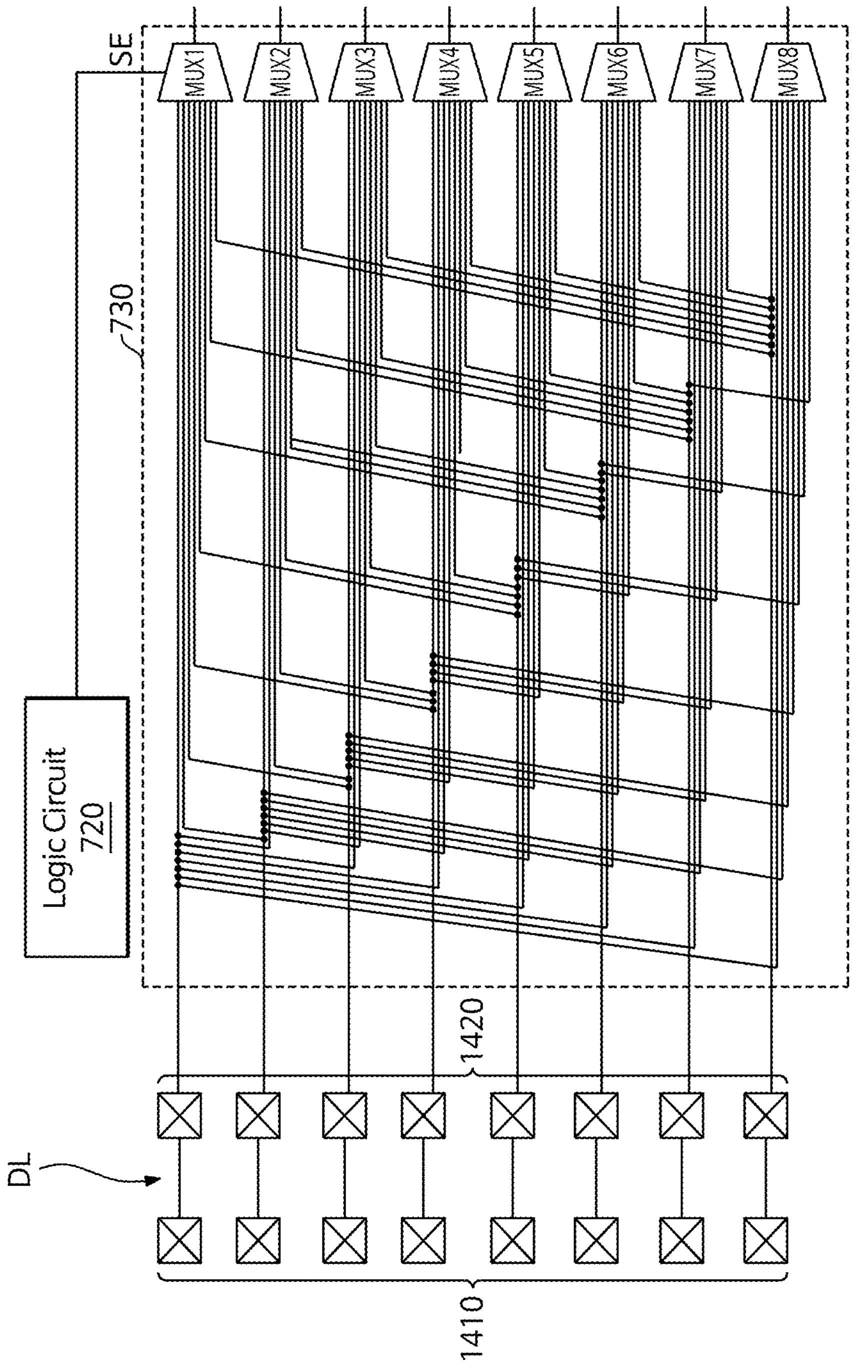
FIG. 14 is a diagram illustrating a structure of the swap circuit according to some example embodiments.

FIG. 14 is a diagram illustrating a structure of the swap circuit 730 according to some example embodiments. The swap circuit 730 may include a plurality of multiplexers MUX1 to MUX8. Each of the plurality of multiplexers MUX1 to MUX8 may be connected to the plurality of data lines DL. Each of data pins 1410 and 1420 illustrated in FIG. 14 may be the first data pin P28 or the second data pin P18 described above.

The logic circuit 720 may transmit, transfer, or send a selection signal to the plurality of multiplexers MUX1 to MUX8 for selecting a data line among the plurality of data lines DL, on which each of the plurality of multiplexers MUX1 to MUX8 is to transmit, transfer, or send or receive data. The selection signal may be included in the swap enable signal SE or transmitted, transferred, or sent separately.

The selection signal may be continuously transmitted, transferred, or sent to the plurality of multiplexers MUX1 to MUX8, or may be converted into a sustain signal to maintain the plurality of multiplexers MUX1 to MUX8 in the active state.

Figure 15:
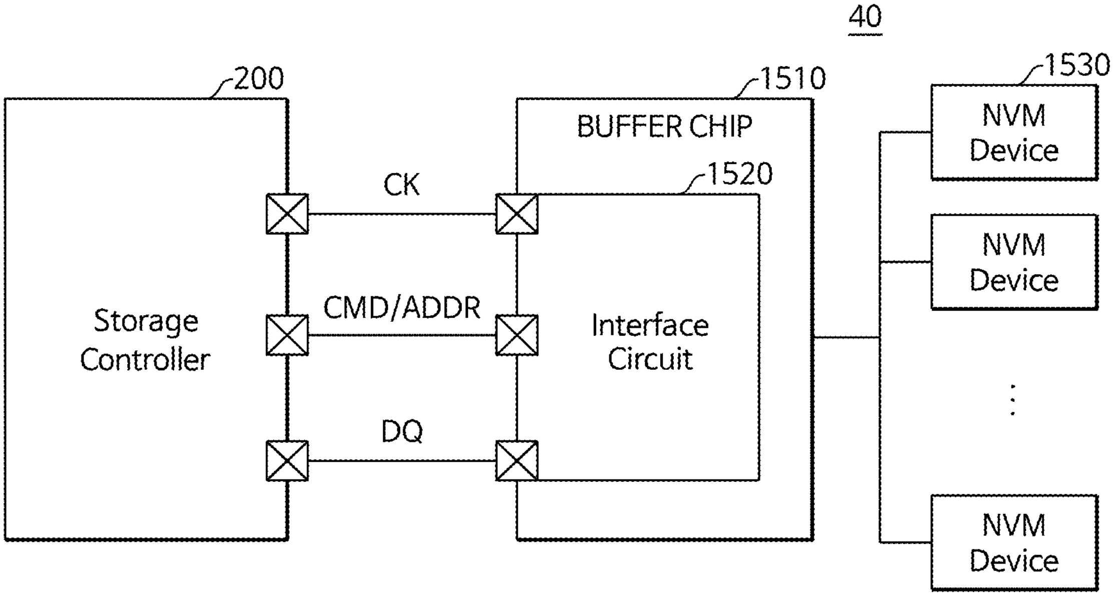
FIG. 15 is a block diagram illustrating a storage device according to some example embodiments.

FIG. 15 is a block diagram illustrating a storage device according to some example embodiments.

Referring to FIG. 15, the storage device 40 may include the storage controller 200, a buffer chip 1510, and a plurality of non-volatile memory devices 1530.

The buffer chip 1510 may be positioned between the storage controller 200 and the plurality of non-volatile memory devices 1530. The buffer chip 1510 may be configured to parallelize the data signals DQ received from the storage controller 200 and transmit, transfer, or send the same to the plurality of non-volatile memory devices 1530, and serialize the data signals DQ received from the plurality of non-volatile memory devices 1530 and transmit, transfer, or send the same to the storage controller 200.

The buffer chip 1510 may include an interface circuit 1520, and the interface circuit 1520 may perform the operation of the memory interface circuit 310 described above with reference to, e.g., FIGS. 1 to 14.

Figure 16:
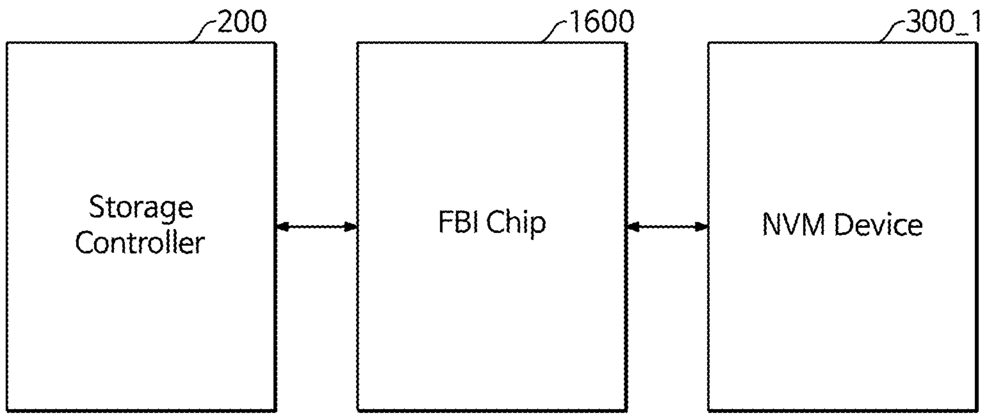
FIG. 16 is a block diagram illustrating a storage device according to some example embodiments.

FIG. 16 is a block diagram illustrating the storage device according to some example embodiments including an FBI chip 1600.

Referring to FIG. 16, the storage device may further include the frequency boosting interface (FBI) chip 1600. The FBI chip 1600 may be disposed (e.g., located) between the storage controller 200 and the non-volatile memory device 300_1 and may be configured to receive data from the storage controller 200 and transfer or send the same to the non-volatile memory device 300_1, and may receive data from the non-volatile memory device 300_1 and transfer or send the same to the storage controller 200. The FBI chip 1600 may perform the operations of the memory interface circuit 310 described above with reference to, e.g., FIGS. 1 to 14. Although only one non-volatile memory device 300_1 is illustrated in FIG. 16 example embodiments are not limited thereto, and, in some example embodiments, the plurality of non-volatile memory devices 300_1 communicating data with the FBI chip 1600 may be implemented.

While the present inventive concepts have been shown and described with reference to some example embodiments thereof, it will be apparent to those of ordinary skill in the art that various changes and modifications in form and detail may be made thereto without departing from the spirit and scope of the present inventive concepts as set forth in the following claims. Accordingly, the scope of the present inventive concepts should not be solely determined by the above-described example embodiments and should be determined by the accompanying claims and the equivalents thereof.

The invention claimed is:

1. A method of operating a storage device including a storage controller and a memory device, the method comprising:

sending, by the storage controller, a command including a first data pattern, through a command/address line;

generating, by the memory device, in response to receiving the command from the storage controller, a second data pattern corresponding to the first data pattern based on the command;

sending, by the memory device, the second data pattern to the storage controller through a plurality of data lines;

receiving, by the storage controller, in response to the memory device sending the second data pattern, a third data pattern;

determining, by the storage controller, the second data pattern based on the command, independently from the memory device generating the second data pattern; and determining, by the storage controller, based on the second data pattern and the third data pattern, a connection structure between a plurality of first data pins of the storage controller and a plurality of second data pins of the memory device, the plurality of first data pins and the plurality of second data pins being connected to each other through the plurality of data lines.

2. A storage controller, comprising:

a plurality of first data pins;

processing circuitry configured to generate a first data pattern; and a logic circuit configured to, send a command including the generated first data pattern to a memory device through a command/address line, wherein the memory device is configured to generate a second data pattern based on the first data pattern included in the command;

receive, in response to the memory device sending the second data pattern through a plurality of data lines, a third data pattern, the second data pattern generated based on the command;

determine the second data pattern based on the command, independently from the memory device generating the second data pattern; and determine, based on the second data pattern and the third data pattern, a connection structure between the plurality of first data pins and a plurality of second data pins of the memory device, the plurality of first data pins being connected to the plurality of second data pins through the plurality of data lines.

3. The storage controller according to claim 2, wherein the logic circuit is further configured to determine to activate a swap circuit connected to the plurality of data lines by comparing an arrangement of the determined second data pattern and an arrangement of the third data pattern.

4. A storage device, comprising:

a storage controller including a plurality of first data pins, the storage controller configured to send a command through a command/address (CA) line, the command including a first data pattern; and a memory device including a plurality of second data pins connected to the plurality of first data pins through a plurality of data lines, wherein the memory device is configured to:

receive, from the storage controller, the command including the first data pattern, and generate a second data pattern based on the first data pattern included in the command, and send the second data pattern to the storage controller through the plurality of data lines, and wherein the storage controller is configured to:

receive a third data pattern in response to the memory device sending the second data pattern, determine the second data pattern based on the command, independently from the memory device generating the second data pattern, and determine a connection structure between the plurality of first data pins and the plurality of second data pins by comparing the second data pattern determined at the storage controller and the third data pattern received at the storage controller.

5. The storage device according to claim 4, wherein the storage controller is further configured to determine, based on the second data pattern and the third data pattern, to activate a swap circuit connected to the plurality of data lines, and the swap circuit is configured to change, based on the swap circuit being activated, a signal arrangement of data input to the swap circuit.

6. The storage device according to claim 5, wherein the storage controller is further configured to:

determine to activate the swap circuit by comparing an arrangement of the determined second data pattern with an arrangement of the third data pattern.

7. The storage device according to claim 5, wherein the storage controller is further configured to deactivate the swap circuit based on the second data pattern being a same as the third data pattern.

8. The storage device according to claim 5, wherein the storage controller is further configured to send a swap enable signal to the swap circuit for activating the swap circuit, based on the second data pattern and the third data pattern being different.

9. The storage device according to claim 8, wherein the swap circuit comprises a plurality of multiplexers, each of the plurality of multiplexers are connected to the plurality of data lines, and the storage controller is further configured to send to the plurality of multiplexers, the second data pattern and the third data pattern being different from each other, a selection signal for selecting a data line to be connected to each of the plurality of multiplexers from among the plurality of data lines.

10. The storage device according to claim 8, wherein the storage controller comprises the swap circuit, the swap circuit is further configured to receive first data to be sent to the memory device, the first data including a first arrangement of data signals, and output second data to the plurality of first data pins, the second data including a second arrangement of data signals changed from the first arrangement of data signals included in the first data, the memory device is configured to receive third data through the plurality of data lines, the third data including a third arrangement of data signals changed from the second arrangement of data signals included in the second data, and the third data is a same as the first data.

11. The storage device according to claim 8, wherein the storage controller comprises the swap circuit, the storage controller is further configured to receive, through the plurality of data lines, second data with an arrangement of data signals changed from an arrangement of data signals included in first data to be sent from the memory device to the storage controller, the swap circuit is further configured to receive the second data, and output third data with an arrangement of data signals changed from the arrangement of data signals included in the second data, and the third data is a same as the first data.

12. The storage device according to claim 8, wherein the memory device comprises the swap circuit, the swap circuit is further configured to receive first data to be sent from the memory device to the storage controller, the first data including a first arrangement of data signals, and output second data to the plurality of second data pins, the second data including a second arrangement of data signals changed from the first arrangement of data signals included in the first data, the storage controller is further configured to receive third data through the plurality of data lines, the third data including a third arrangement of data signals changed from the second arrangement of data signals included in the second data, and the third data is a same as the first data.

13. The storage device according to claim 8, wherein the memory device comprises the swap circuit, the memory device is configured to receive, through the plurality of data lines, second data with an arrangement of data signals changed from an arrangement of data signals included in first data to be sent from the storage controller to the memory device, the swap circuit is further configured to receive the second data, and output third data with an arrangement of data signals changed from the arrangement of data signals included in the second data, and the third data is a same as the first data.

14. The storage device according to claim 4, wherein the plurality of second data pins of the memory device are in a same order as the plurality of first data pins of the storage controller, or in a reverse order from the plurality of first data pins of the storage controller, and the second data pattern includes a same number of bits as a number of the plurality of data lines.

15. The storage device according to claim 4, wherein the second data pattern includes a plurality of patterns, each of the plurality of patterns includes a same number of bits as a number of the plurality of data lines, one of the same number of bits as the number of the plurality of data lines is a first bit, bits other than the one of the same number of bits as the number of the plurality of data lines are second bits, and the second bits are opposite bits of the first bit.

16. The storage device according to claim 15, wherein the number of the plurality of patterns is a same as or one less than the number of the plurality of data lines, and each of the plurality of patterns is different.

17. The storage device according to claim 4, wherein the second data pattern includes a same number of unique identification patterns as a number of the plurality of data lines, the third data pattern includes a plurality of patterns, each of the plurality of patterns includes a same number of bits as the number of the plurality of data lines, and based on the plurality of first data pins sequentially receiving the plurality of patterns, each of the plurality of first data pins receives a pattern corresponding to any one of the unique identification patterns.

18. The storage device according to claim 4, wherein the command is a read training command, and the second data pattern is stored in a register of the memory device and sent from the register to the storage controller.

19. The storage device according to claim 4, wherein the storage controller is connected to each of a plurality of memory devices comprising the memory device.

20. The storage device according to claim 19, wherein each of the plurality of memory devices is selectively connected to a channel, the channel including the command/address line and the plurality of data lines to communicate with the storage controller.

* * * * *